(12) United States Patent
Sakata et al.

(10) Patent No.: US 10,354,903 B2
(45) Date of Patent: Jul. 16, 2019

(54) LOAD PORT AND LOAD PORT ATMOSPHERE REPLACING METHOD

(71) Applicant: RORZE CORPORATION, Fukuyama-shi, Hiroshima (JP)

(72) Inventors: Katsunori Sakata, Fukuyama (JP); Hidekazu Okutsu, Fukuyama (JP)

(73) Assignee: RORZE CORPORATION, Fukuyama-Shi, Hiroshima (JP)

( * ) Notice: Subject to any disclaimer, the term of this patent is extended or adjusted under 35 U.S.C. 154(b) by 247 days.

(21) Appl. No.: 15/449,360

(22) Filed: Mar. 3, 2017

(65) Prior Publication Data

US 2017/0178942 A1    Jun. 22, 2017

Related U.S. Application Data

(63) Continuation of application No. PCT/JP2015/074273, filed on Aug. 27, 2015.

(30) Foreign Application Priority Data

Sep. 5, 2014   (JP) .................................. 2014-181229

(51) Int. Cl.
*H01L 21/677*  (2006.01)
*H01L 21/673*  (2006.01)
*H01L 21/687*  (2006.01)

(52) U.S. Cl.
CPC .. *H01L 21/67778* (2013.01); *H01L 21/67389* (2013.01); *H01L 21/67393* (2013.01);
(Continued)

(58) Field of Classification Search
CPC ......... H01L 21/67778; H01L 21/67389; H01L 21/67393; H01L 21/67772; H01L 21/68707; B65G 2201/0297
See application file for complete search history.

(56) References Cited

U.S. PATENT DOCUMENTS

2002/0006876 A1*  1/2002  Hongo ................. B24B 37/345
                                                            156/345.12
2002/0089655 A1*  7/2002  Kida .................... G03F 7/70691
                                                               355/72
(Continued)

FOREIGN PATENT DOCUMENTS

CN       101116181 A    1/2008
JP       2009-038074 A  2/2009
(Continued)

OTHER PUBLICATIONS

PCT/ISA/210, "International Search Report for International Application No. PCT/JP2015/074273," dated Oct. 27, 2015.
(Continued)

*Primary Examiner* — Saul Rodriguez
*Assistant Examiner* — Ashley K Romano
(74) *Attorney, Agent, or Firm* — Manabu Kanesaka

(57) ABSTRACT

Provided is a load port capable of loading and unloading a substrate by a transfer robot in a state where a purge gas atmosphere is maintained inside a substrate storage space. After the lid of the substrate storage container is opened, an opening portion of the substrate storage container is closed by a frame sealing a peripheral edge of the opening portion of the substrate storage container and a shutter portion where a plurality of shielding plates are disposed in a vertical direction at a third position which is further moved forward from a release position. The shutter portion can locally move all or a portion of the shielding plates to form a narrow opening portion (third opening portion), and transferring of the substrate in the state where an atmosphere of the substrate storage space is replaced is performed through the narrow opening portion (third opening portion).

13 Claims, 18 Drawing Sheets

(52) U.S. Cl.
CPC .. *H01L 21/67772* (2013.01); *H01L 21/67775* (2013.01); *H01L 21/68707* (2013.01); *B65G 2201/0297* (2013.01)

(56) References Cited

U.S. PATENT DOCUMENTS

| | | | |
|---|---|---|---|
| 2003/0092261 A1* | 5/2003 | Kondo | B24B 37/005 438/638 |
| 2004/0152322 A1 | 8/2004 | Tokunaga | |
| 2006/0182560 A1* | 8/2006 | Mitsuyoshi | H01L 21/67769 414/411 |
| 2007/0238062 A1* | 10/2007 | Asari | F27B 17/0025 432/253 |
| 2009/0035100 A1 | 2/2009 | Okabe et al. | |
| 2009/0053019 A1 | 2/2009 | Osaki et al. | |
| 2009/0095327 A1* | 4/2009 | Hwang | B08B 3/02 134/30 |
| 2009/0169342 A1 | 7/2009 | Yoshimura et al. | |
| 2012/0100709 A1* | 4/2012 | Minami | C25D 17/00 438/597 |
| 2015/0098788 A1* | 4/2015 | Wakabayashi | H01L 21/67769 414/749.1 |
| 2015/0340259 A1 | 11/2015 | Wakabayashi | |
| 2016/0365264 A1* | 12/2016 | Tokunobu | H01L 21/67017 |
| 2017/0178940 A1* | 6/2017 | Yazawa | H01L 21/67173 |
| 2017/0263479 A1* | 9/2017 | Honsho | B65D 43/0202 |
| 2017/0294328 A1* | 10/2017 | Honsho | H01L 21/67369 |
| 2018/0001440 A1* | 1/2018 | Aono | B08B 1/003 |

FOREIGN PATENT DOCUMENTS

| | | |
|---|---|---|
| JP | 5448000 B2 | 3/2014 |
| TW | 200425379 A | 11/2004 |
| WO | 2005/124853 A1 | 12/2005 |
| WO | 2014/080851 A1 | 5/2014 |

OTHER PUBLICATIONS

Japan Patent Office, "Office Action for Japanese Patent Application No. 2016-546599," dated Jan. 11, 2019.
China Patent Office, "Office Action for Chinese Patent Application No. 201580047472.5," dated Feb. 19, 2019.
Taiwan Patent Office, "Office Action for Taiwanese Patent Application No. 104129218," dated Feb. 22, 2019.

* cited by examiner

LOAD PORT AND LOAD PORT ATMOSPHERE REPLACING METHOD

CROSS-REFERENCE TO RELATED APPLICATION

This is a continuation application of PCT International Application No. PCT/JP2015/074273 filed on Aug. 27, 2015, which claims a priority of Japanese Patent Application No. 2014-181229 filed on Sep. 5, 2014, the disclosure of which is incorporated herein.

TECHNICAL FIELD

The present invention relates to a load port for loading or unloading a thin-plate-shaped substrate or the like into and from a hermetically-sealed container containing various kinds of thin-plate-shaped substrates such as a semiconductor wafer. Particularly, the present invention relates to a load port and a load port atmosphere replacing method having an atmosphere replacing function for replacing an atmosphere in an hermetically-sealed container with an atmosphere such as an inert gas at the time of loading or unloading a thin-plate-shaped substrate or the like into the hermetically-sealed container. The hermetically-sealed container for accommodating a plurality of substrates or the like in an atmosphere isolated from an external environment is used in order to transfer the thin plate-shaped substrate to several places for treatments in various processing steps.

BACKGROUND ART

In this specification, various kinds of thin-plate-shaped substrates and the like refer to thin-plate-shaped substrates such as a semiconductor wafer, a substrate for a liquid crystal display panel, a substrate for an organic EL display panel, a substrate for a plasma display panel, or a substrate for a solar cell panel. In the following description, these various kinds of thin-plate-shaped substrates or the like are simply referred to as a "substrate" or "thin-plate-shaped substrate".

In order to prevent particles floating in the air from being adhered to the thin-plate-shaped substrate, in various processing apparatuses performing various processes such as film formation and etching on the thin-plate-shaped substrate such as a semiconductor wafer, an EFEM (Equipment Front End Module) performing moving and mounting of the substrate, an apparatus called a sorter reading and sorting lot numbers, and the like, in the related art, adopted is a so-called mini-environment system where an internal atmosphere of the apparatus to which the thin-plate-shaped substrate is exposed is maintained to be highly clean. The mini-environment system refers to a configuration where, by supplying highly purified air only to a comparatively small space (mini-environment space) inside the EFEM, the space where the substrate is present is maintained to have a high degree of cleanliness with relatively low costs.

In recent years, however, miniaturization of the semiconductor circuit line width has rapidly progressed, and thus, there occur problems that only the high cleaning by using the mini-environment system of the related art cannot cope with the miniaturization. Particularly, if a thin-plate-shaped substrate immediately after being processed by a processing apparatus is loaded into a hermetically-sealed container, oxygen or moisture in the air inside the hermetically-sealed container reacts with the surface of the thin-plate-shaped substrate, and in some cases, undesirable natural oxidation films are generated during various processing steps. Due to the existence of such oxide films, there occurs a problem that elements formed on the surface of the thin-plate-shaped substrate cannot secure desired characteristics. In addition, substances used in the processing apparatus are transferred into the hermetically-sealed container in a state where the substances are adhered to the thin-plate-shaped substrate, so that the substances also contaminate other thin-plate-shaped substrates in the hermetically-sealed container and adversely affect the following processing steps, which may lead to deterioration of the yield.

As a method for solving such problems, in the related art, various methods have been considered to prevent oxidation of the surface of the thin-plate-shaped substrate by removing air and contaminants that have intruded into the hermetically-sealed container by using an inert gas and allowing the inner portion of the hermetically-sealed container to be filled with an inert gas. Patent Document 1 discloses a method of removing contaminants attached to a wafer surface by supplying an inert purge gas into an FOUP (Front Opening Unified Pod) which is one of hermetically-sealed containers with respect to a wafer mounted on the FOUP. The purge gas is supplied from a purge plate provided so as to be movable forward and backward at a position separated by a predetermined distance from the wafer. An element for suppressing an ejection force of the purge gas is provided at the distal end portion of a purge gas supply nozzle accommodated inside the purge plate to prevent the purge gas from being strongly ejected into the FOUP.

According this method, a large amount of the purge gas is supplied into the FOUP without generating a turbulence flow, so that it is possible to replace an internal atmosphere of the FOUP in a short time without scattering dust staying inside the FOUP.

CITATION LIST

Patent Document

Patent Document 1: Japanese Patent No. 5448000

SUMMARY OF THE INVENTION

Problem to be Solved by the Invention

However, in the above-described method, the internal atmosphere of the FOUP is replaced by a purge gas immediately before the opening portion of the FOUP is closed by the cover. On the other hand, the opening portion of the FOUP is not closed by the cover until all processed substrates are stored in the FOUP. For this reason, the surfaces of the substrates placed inside the FOUP are exposed to oxygen or moisture in the air for a long time until the atmosphere is replaced by the purge gas. Particularly, in the case of a processing step requiring a long time from when the first substrate is transported into the FOUP until the last substrate is transported, oxidation of the surface of the substrate exposed to oxygen or moisture before the atmosphere is replaced by the purge gas proceeds. For this reason, there is a problem that the semiconductor element cannot have desired characteristics due to the generated oxide film.

In order to solve the above-described problems of the related art, the present invention is to provide an atmosphere replacing apparatus of preventing oxidation of a semiconductor circuit formed on a surface of a substrate by speedily purging the surface of the substrate which is loaded into an FOUP after surface treatment is finished.

Means for Solving Problem

In order to solve the above-mentioned problems of the related art, in the present invention, a shutter portion being capable of shielding a first opening portion of a substrate storage container at a third position which is further located backward from a second position where a lid of the substrate storage container is detached and being capable of partially opened and closed is provided, and a purge gas is supplied into the closed space to prevent chemical changes such as oxidation of the substrate. The shutter portion has a shielding portion, and by opening and closing the shielding portion, it is possible to open and close a third opening portion which is narrower than the first opening portion part. The substrate is loaded into or unloaded from the substrate storage container through the third opening portion. Since the third opening portion is narrower (smaller) than the first opening portion, an amount of the purge gas leaking to the outside is small.

According to a first aspect of the present invention, there is provided a load port having an atmosphere replacing function, a plurality of shelf plates being disposed at a certain interval in a vertical direction and being formed so as to mount and accommodate a plurality of substrates therein, mounting a substrate storage container having a first opening portion for loading and unloading the substrate and a lid portion capable of opening and closing the first opening portion, the load port for loading and unloading the substrate into and from the substrate storage container, the load port including: a stage mounting and fixing the substrate storage container at a first position, a stage drive unit moving the stage forward and backward among the first position, a second position, and a third position; a door being engaged with the lid portion of the substrate storage container at the second position as a position being moved forward from the first position to attach and detach the lid portion to and from the substrate storage container; a door elevating unit moving the door upward and downward; a frame being in contact with a peripheral edge of the substrate storage container at the third position as a position being further moved forward from the second position; a shutter portion having a plurality of shielding plates being capable of be opened and closed and being disposed so as to close the entire second opening portion surrounded by the frame on a side opposite to the substrate storage container of the frame; a shutter drive unit selectively opening and closing a portion of the shutter portion so as to provide a third opening portion being smaller than the second opening portion at a desired position of the shutter portion; and at least one purge nozzle supplying a purge gas into the substrate storage container.

As the purge nozzle, a bottom-portion purge nozzle supplying the purge gas to a bottom portion of the substrate storage container, a side surface purge nozzles supplying the purge gas to a side surface of the opening portion of the substrate storage container, or the like may be provided. With the above-described configuration, it is possible to replace an atmosphere inside a space surrounded by the substrate storage container and the shutter portion that is the space where the substrate is accommodated by using the purge gas, and only at the time of loading and unloading the substrate, it is possible to open and close only the narrow third opening portion. Therefore, it is unnecessary to open the first opening portion for a long time at the time of loading and unloading, and it is possible to prevent an external atmosphere from intruding into the substrate storage container.

According to another embodiment of the present invention, in the load port having an atmosphere replacing function, the shutter portion includes a plurality of shielding plates stacked so as to be movable upward and downward, and the shutter drive unit includes a shielding plate drive unit opening and closing the third opening portion by being engaged with the shielding plate at a desired position to move the shielding plate and the shielding plates stacked on the shielding plate upward and downward.

According to another embodiment of the present invention, there is provided load port atmosphere replacing method, a plurality of shelf plates being disposed at a certain interval in a vertical direction and being formed so as to mount and accommodate a plurality of substrates therein, a load port for loading and unloading the substrate into and from a substrate storage container having a first opening portion for loading and unloading the substrate and a lid portion capable of opening and closing the first opening portion, the load port atmosphere replacing method preventing oxidation of a semiconductor circuit formed on a surface of the substrate by speedily purging the surface of the substrate being loaded into the substrate storage container, the load port atmosphere replacing method including: mounting the substrate storage container on a stage being stopped at a first position; moving the stage forward from the first position to a second position to detach the lid of the substrate storage container; supplying a purge gas into the storage container while further moving the stage forward from the second position; moving the stage forward to a third position, the substrate being loaded and unloaded at the third portion, so as to allow the peripheral edge of the first opening portion of the substrate storage container to be in contact with the frame; in response to an access request signal to the shelf portion of the substrate storage container, opening a portion of the shutter portion shielding the second opening portion as the opening portion of the frame, and forming a third opening portion having an opening portion being narrower than the first opening portion at a position corresponding to the position of the shelf portion associated with access request; and closing the third opening portion in response to an access end signal to the shelf portion.

Effect of the Invention

According to the present invention, since the purge gas can be supplied into the substrate storage container in the state where the lid is removed, the substrate storage container is filled with the purge gas without waiting for completion of loading or unloading of the substrate, so that it is possible to prevent or suppress oxidation or the like of the substrate. In addition, since the third opening portion that is narrower than the opening portion of the substrate storage container is opened and closed so that the substrate can be loaded or unloaded, it is possible to maintain the purge gas atmosphere inside the substrate storage container to be at a high concentration, and it is possible to suppress oxidation and the like of the surface of the substrate.

MODE(S) FOR CARRYING OUT THE INVENTION

Figure 1:
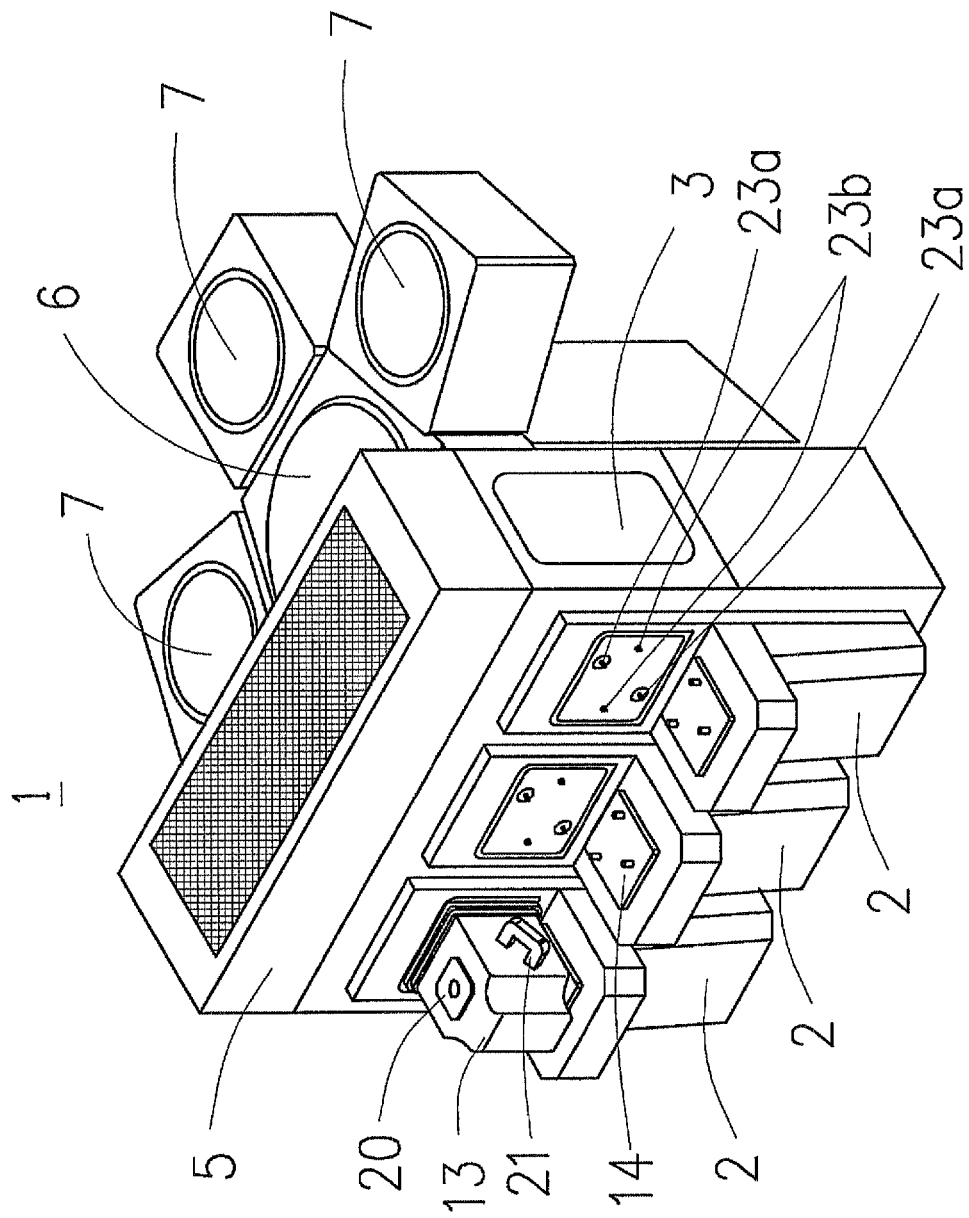
FIG. 1 is a perspective diagram illustrating an overview of a general hybrid processing apparatus 1.
Figure 2:
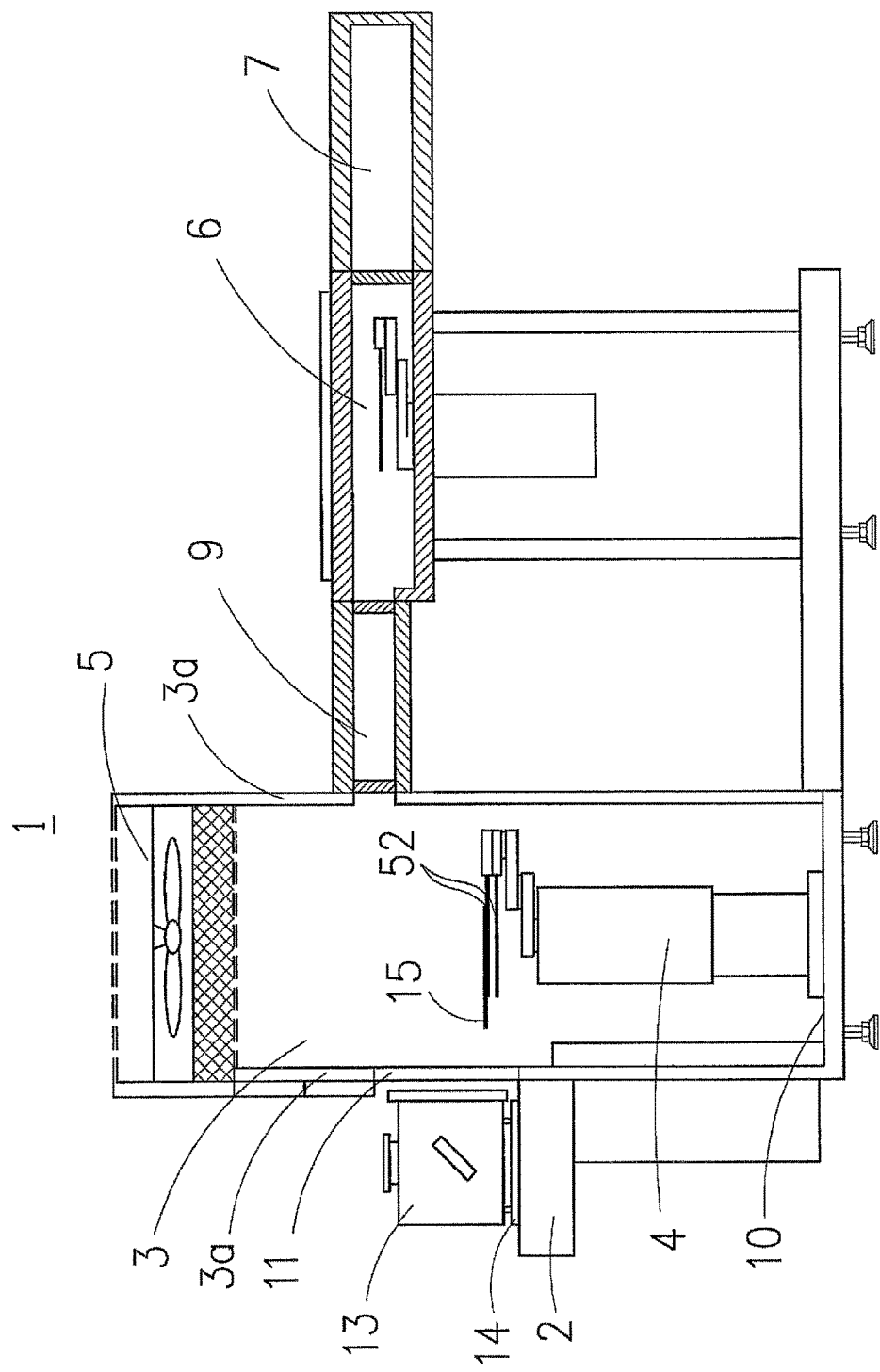
FIG. 2 is a cross-sectional diagram of a hybrid processing apparatus 1.

Hereinafter, embodiments of the present invention will be described in detail with reference to the drawings. FIG. 1 is a perspective diagram illustrating a hybrid processing apparatus 1 including a load port, a mini-environment device, various processing devices, and the like. FIG. 2 is a schematic diagram illustrating a cross section thereof. The hybrid processing apparatus 1 is installed in a factory controlled to a relatively clean atmosphere called a class-100 clean room where there are 100 or less of dust particles having a size of 0.5 μm or more per cubic feet. The hybrid processing apparatus 1 is configured to mainly include a load port 2, a mini-environment space 3, a transfer robot 4, a fan filter unit 5, a transfer chamber 6, various process chambers (processing apparatuses) 7, and a load lock chamber 9. The mini-environment space 3 is a closed space formed by a frame 3a, a wall surface fixed to the frame 3a for separating from an external atmosphere, and the fan filter unit 5 installed on the ceiling. The fan filter unit 5 is a high clean air introduction means installed on the ceiling to clean air from the outside into highly purified air and, after that, to introduce the air as a downward laminar flow into the mini-environment space 3. The fan filter unit 5 is provided with a fan for supplying air downward toward the inner portion of the mini-environment space 3 and a high performance filter for removing contaminants such as minute dust and organic materials present in the incoming air. An air circulating member such as a punching plate having a predetermined opening ratio is attached to a floor surface 10 of the mini-environment space 3.

With the above-described configuration, clean air supplied from the fan filter unit 5 into the mini-environment space 3 always flows downward in the mini-environment space 3 and is discharged from the floor surface 10 to the outside of the apparatus. In addition, dust generated by operations of the transfer robot 4 and the like is also discharged to the outside of the apparatus through the downward flow. Therefore, the inner portion of the mini-environment space 3 is maintained to be in a high clean atmosphere. The transfer robot 4 retains a wafer 15 which is one type of thin-plate-shaped substrate, on a finger 52 and transfers the wafer between the FOUP 13 and the process chamber 7. In the transfer robot 4, a movable portion of the arm is formed as a dust generation preventing structure such as a magnetic fluid seal, so that contrivance is made to minimize adverse influence on the wafer 15 caused by dust generation. Furthermore, the atmospheric pressure of the inner portion of the mini-environment space 3 is maintained to be at a positive pressure of about 1.5 Pa higher than the external atmosphere, so that contaminating materials and dust from the outside are prevented from intruding. As a result, the inner portion of the mini-environment space 3 is configured to maintain a high degree of cleanliness of class 1 or more where one or less of 0.5 μm dust is contained in 1 cubic feet.

Figure 3:
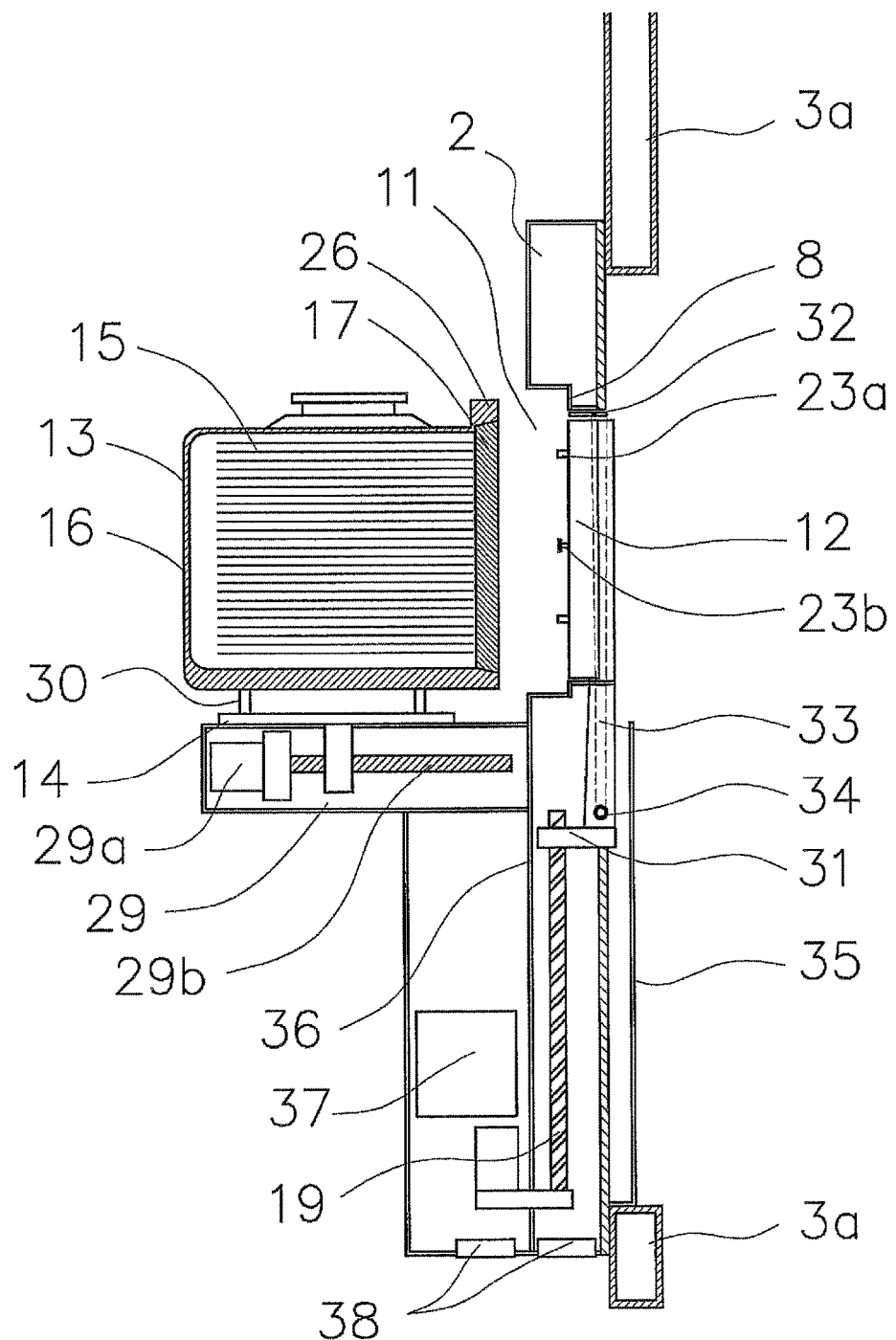
FIG. 3 is a perspective diagram illustrating an overview of a load port 2 of the related art.

Next, the load port 2 of the related art where the FOUP 13 is mounted and the lid 17 of the FOUP 13 is opened and closed will be described with reference to FIG. 3. The load port 2 of the related art is configured to include a stage 14 where the FOUP 13 is mounted at a predetermined position, a port opening portion 11 having an area through which the wafer 15 can pass, a door (FIMS door) 12 integrated with the lid 17 of the FOUP 13 when the stage 14 is moved to a predetermined position, a stage drive unit 29 for moving the stage 14 forward and backward with respect to the FIMS door 12, and an FIMS door elevating unit 19 for moving the FIMS door 12 upward and downward, and the load port is fixed at a predetermined position of the frame 3a constituting the mini-environment space 3. Herein, FIMS is an abbreviation to "Front-Opening Interface Mechanical Standard, a standard defined by SEMI, which is an international standard on semiconductors. Furthermore, the stage 14 is configured to include kinematic pins 30 for mounting the FOUP 13 at a predetermined position and a fixing means (not shown) for fixing the FOUP 13 mounted at the predetermined position. The stage drive unit 29 is configured to include a motor 29a as a drive source and a feed screw 29b. The rotation of the motor 29a is configured to be transmitted to the feed screw 29b, so that the stage 14 can be moved to an arbitrary position. Instead of the motor 29a and the feed screw 29b, the stage drive unit 29 may be configured to be provided with a cylinder using a fluid pressure such as an air pressure or a hydraulic pressure.

The FOUP 13 is accurately mounted at a predetermined position on the stage 14 by the kinematic pins 30 disposed on the stage 14. In addition, the FOUP 13 is moved forward to the FIMS door 12 by the operation of the stage drive unit 29, so that the lid 17 of the FOUP 13 and the FIMS door 12 are in contact with each other. When the FOUP 13 is moved to the position where the lid 17 and the FIMS door 12 are in contact with each other, the flange portion 26 formed in the FOUP 13 and the flange panel 8 provided around the port opening portion 11 of the load port 2 have such a position relationship that the flange portion and the flange panel face each other. Herein, in the structure of the load port 2 of the related art, although the FIMS door 12 is moved downward so that the stage 14 is in the state where the stage can be moved forward, the flange panel 8 and the flange portion 26 are in contact with each other, and thus, the stage 14 cannot be further moved forward.

The flange panel 8 is a plate-shaped member provided so as to surround the peripheral edge of the port opening portion 11, and the gap between the peripheral edge of the port opening portion 11 and the flange portion 26 of the FOUP 13 are regulated. When the flange panel 8 and the flange portion 26 are in contact with each other, the port opening portion 11 is closed, so that a low clean air containing external dust is prevented from flowing into the mini-environment space 3. Alternatively, the flange panel 8 is disposed so as to provide a slight gap between the flange panel and the flange portion 26, so that the clean air filling the inner portion of the mini-environment space 3 having a high internal pressure flows out through the gap. Therefore, the flange panel serves to prevent the air containing external dust from flowing into the inner portion of the mini-environment space.

The FIMS door 12 performs door opening and closing operations on the FOUP 13. The door opening and closing operations of the FIMS door 12 is performed by integrating the FIMS door 12 and the lid 17 of the FOUP 13 and, after that, reciprocating the integrated FIMS door 12 back and forth to the position separated from the FOUP 13 or allowing the stage drive unit 29 to reciprocate the stage 14 on which the FOUP 13 is mounted to the position separated from the FIMS door 12 integrated with the lid 17.

The FIMS door 12 is provided with a registration pin 23a for positioning and a latch key 23b integrated with the lid 17 by a suction force. By fitting the latch key 23b into a latch key hole 24 (refer to FIG. 4B) provided in the lid 17 and rotating the latch key, the lock mechanism 25 is changed over to the locked state or the unlocked state. With the configuration, by the operation of the stage drive unit 29, the lid 17 which is in contact with the FIMS door 12 is released from the locked state with the carrier 16. Furthermore, the lid 17 and the FIMS door 12 are integrated with each other by rotating the latchkey 23b in the unlocking direction. Herein, "the lid 17 and the FIMS door 12 are integrated" denotes that the lid and the FIMS door are fixed in the state where the lid and the FIMS door are coupled to each other by a mechanical means. In addition, such a mechanism is compatible with the FIMS (Front-Opening Interface Mechanical Standard) system defined by the SEMI standard which is a standard on semiconductor manufacturing.

When the lid 17 and the FIMS door 12 are integrated with each other, the stage 14 operates to retract the carrier 16 in the direction to be separated from the lid 17, so that the lid 17 and the carrier 16 are separated from each other. Alternatively, a mechanism for retracting the integrated FIMS door 12 is provided (not shown), and by the retracting operation, the FIMS door 12 is retracted to be separated from the carrier 16, so that the lid 17 and the carrier 16 are separated from each other. The FIMS door 12 is attached to the FIMS door elevating unit 19 through a bracket 31 so as to be movable upward and downward. After the lid 17 and the carrier 16 are separated from each other, the FIMS door 12 is moved downward to a predetermined position by the FIMS door elevating unit 19. Therefore, the transfer robot 4 can be allowed to access the inner portion of the carrier 16. The transfer robot 4 accesses the inner portion of the carrier 16 to retain the wafer 15 mounted on the shelf 18 of the carrier 16 and transfers the wafer to the process chamber 7 or mounts the wafer 15 of which treatment is completed in the process chamber 7 on the shelf 18 in the carrier 16. In the embodiment, the FIMS door elevating unit 19 is configured to move the FIMS door 12 upward and downward to an arbitrary position by allowing the motor 19a as the drive source to rotate the feed screw 19b in the normal rotation or the reverse rotation. However, alternatively, a cylinder using a fluid pressure such as an air pressure or a hydraulic pressure may be used.

In addition, the load port 2 is also provided with a mapping sensor 32 detecting the presence or absence of the wafer 15 stored in the FOUP 13 and the mounted state thereof. As the mapping sensor 32, a pair of transmissive sensors having an optical axis extending in a direction parallel to the surface on which the wafer 15 is mounted (perpendicular to the paper of FIG. 3) are used. In the mapping sensor 32, a light emitting unit and a sensor unit are attached to the respective distal end portions of a U-shaped sensor attachment portion 33. The sensor attachment portion 33 is disposed so as to surround the upper surface and the left and right surfaces of the FIMS door 12, and the base end of the sensor attachment portion 33 is attached to the sensor drive unit 34. As a drive source of the sensor drive unit 34, a motor or a rotary actuator is preferred. When the drive source is rotated, the sensor attachment portion 33 is rotated around the axis of the drive source so as to move in the direction of the carrier 16, and thus, the mapping sensor 32 enters the inner portion of the carrier 16. The sensor drive unit 34 is fixed to the bracket 31 and can move upward and downward in cooperation with the operation of the FIMS door elevating unit 19. By the operation of the FIMS door elevating unit 19, the sensor attachment portion 33 is moved upward and downward, so that the mapping sensor 32 is moved inside the carrier 19 from the upper surface to the lower surface. Therefore, in the case where the wafer 15 is accommodated in the carrier 19, the optical axis of the mapping sensor 32 is shielded by the thickness of the wafer 15, so that the presence or absence of the wafer 15 with respect to all the shelves 18 in the carrier 16 can be detected. In addition, output signals to the respective drive units or input signals of the sensors or the like are controlled by the control unit 37.

In addition to the above-described configuration, a cover 35 may be provided in order to prevent dust generated from each drive source and movable portion provided in the load port 2 from intruding into the mini-environment space 3, or a portion facing the outside may be covered with a dustproof cover 36 in order to prevent a low clean air from entering from the outside. In addition, an exhaust fan 38 for discharging the dust generated in the load port to the outside may be provided. With the configuration, not only the dust can be prevented from flowing into the mini-environment space 3, but also the downward flow of high clean air flowing in the mini-environment space 3 intrudes from the upper opening portion of the cover 35, so that the dust is discharged to the outside by the exhaust fan 38 provided on the bottom surface of the load port 2.

Figure 4A:
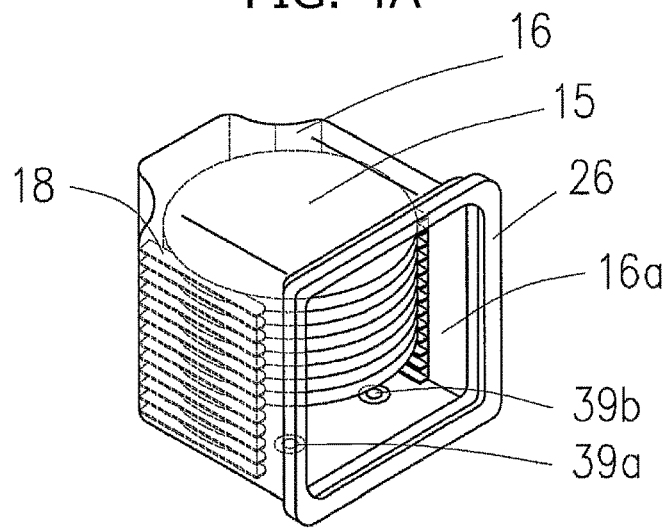
FIG. 4A is a perspective diagram illustrating a structure of an FOUP which is one of wafer containers.
Figure 4B:
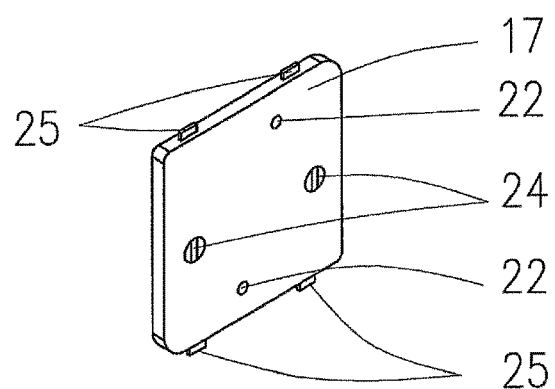
FIG. 4B is a diagram illustrating the surface of the lid on the FIMS door side.
Figure 4C:
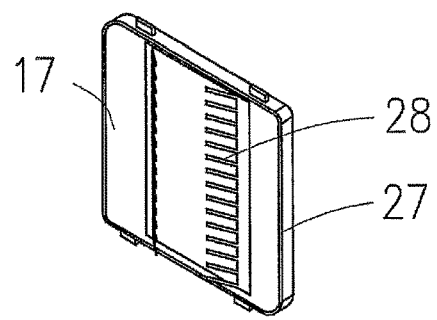
FIG. 4C is a diagram illustrating the surface of the lid on the carrier side.

Next, the FOUP 13 which is an example of a hermetically sealable container will be described with reference to FIGS. 4A-4C. The FOUP 13 is a hermetically sealable container for transferring the wafer 15 as an accommodated object between the processing steps in the state where the inner portion of the FOUP is maintained to be in a high clean atmosphere so as to isolate the wafer from a low-clean external atmosphere. FIG. 4A is a perspective diagram illustrating the FOUP 13 which is one of semiconductor wafer containers. The FOUP 13 is configured to include a carrier 16 which is a box-shaped container for accommodating the wafer 15 and a lid 17 for sealing the first opening portion 16a provided in the carrier 16. In addition, on the inner wall surface of the carrier 16, a plurality of shelf plates 18 for mounting the wafer 15 are provided at predetermined intervals in the vertical direction. FIG. 4B is a diagram illustrating the surface of the lid 17 on the FIMS door 12 side, and FIG. 4C is a diagram illustrating the surface of the lid 17 on the carrier 16 side. The lid 17 is engaged with the carrier 16 on the open surface of the carrier 16 to form the inner portion of the FOUP 13 as a hermetically-sealed space.

On the outside of the lid 17, namely, on the surface of the lid on the FIMS door 12 side, provided are a positioning hole 22 for defining the position of the lid 17 with respect to the FIMS door 12 and a latch key hole 24 for engaging and separating the lid 17 with respect to the carrier 16 by using a latch key 23b provided on the load port 2. In addition, a lock mechanism 25 is provided above and below the lid 17 in order to engage the lid 17 with the flange portion 26 of the carrier 16. The lock mechanism 25 is interlocked with a mechanism provided in the latch key hole 24. By rotating the latch key hole 24 left and right by using the latch key 23b provided in the FIMS door 12, the lock mechanism. 25 can be manipulated into a locked state and an unlocked state.

The surface of the lid 17 on the carrier 16 side will be described with reference to FIG. 4C. A seal material 27 for maintaining airtightness of the inner portion of the FOUP 13 is provided on a peripheral edge of the lid 17 which is in contact with the carrier 16. An elastic retention member 28 for pressing and fixing the edge of the wafer 15 accommodated in the FOUP 13 in the horizontal direction is provided in the vertical direction at the center thereof. Information on detailed dimensions and the like thereof is defined by the SEMI standard which is a standard on semiconductor manufacturing.

Furthermore, on the bottom portion of the carrier 16, a purge port 39 for supplying an inert gas or the like to replace the internal atmosphere of the FOUP 13 with an inert gas or the like is provided at a predetermined position. The purge port 39 is provided with an injection purge port 39a for injecting an inert gas from the outside and a discharge purge port 39b for discharging the air inside the FOUP 13 to the outside. The purge port 39 is provided with a check valve that switches from the closed state to the opened state by an injection pressure of the injection gas or a discharge pressure of the discharged internal atmosphere so as to prevent a reverse flow. In addition, the injection purge port 39a is provided with a filter member for preventing minute dust mixed in the injection gas from intruding into the carrier 16.

Figure 5:
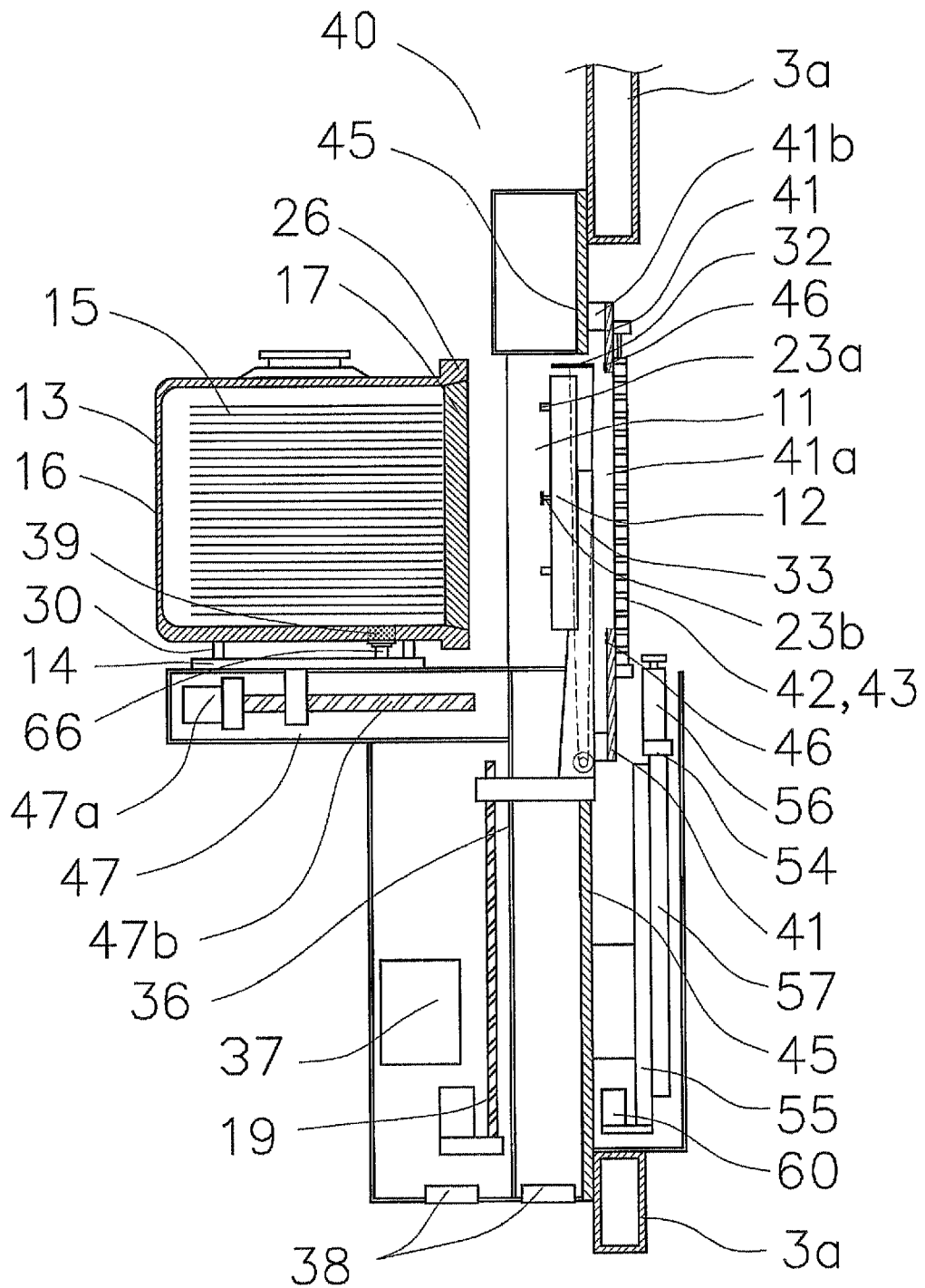
FIG. 5 is a cross-sectional diagram illustrating a load port according to an embodiment of the present invention.
Figure 6:
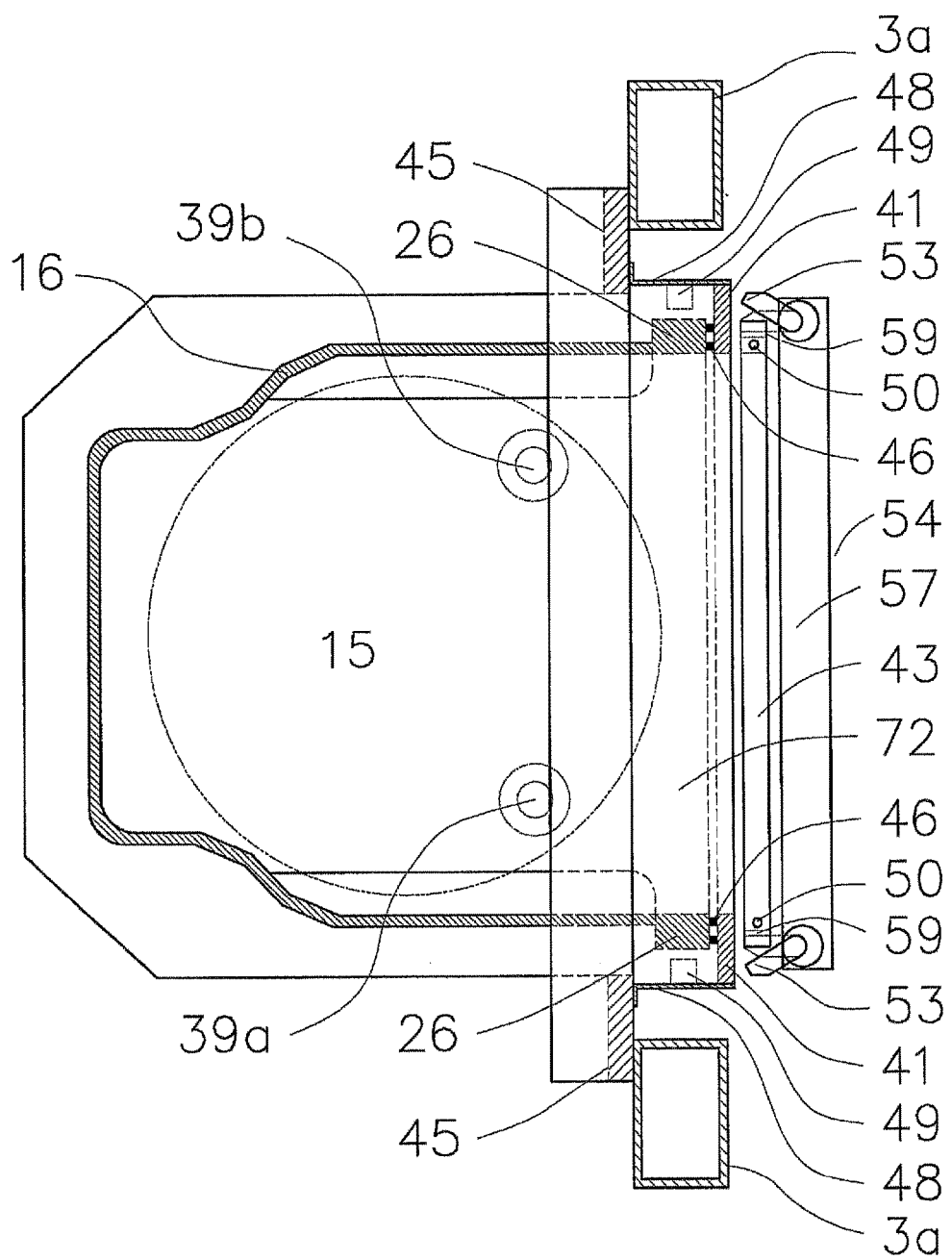
FIG. 6 is a cross-sectional diagram of a periphery of a shutter portion of the load port according the an embodiment of the present invention as viewed from above.

Next, the load port having the atmosphere replacing function according to the present invention will be described in detail. FIG. 5 is a cross-sectional diagram of the load port 40 having an atmosphere replacing function according to an embodiment of the present invention as viewed from the side. FIG. 6 is a cross-sectional diagram illustrating a state where the load port 40 is moved to a later-described third position (substrate transfer position) as viewed from the upper surface. In addition to the above-described configuration of the load port 2 of the related art, the load port 40 is configured to include a frame 41 disposed at a position behind the FIMS door 12, namely, close to the transfer robot 4 as viewed from the stage 14 and a shutter portion 42 configured with a plurality of shielding plates 43 stacked so as to close the opening portion 41a formed in the frame 41. In addition, the stage drive unit 47 is configured to move the stage 14 to a position where the flange portion 26 of the carrier 16 is in contact with the frame 41 after the carrier is mounted on the stage 14 and the lid 17 is removed by the FIMS door 12. In the load port 40 according to the embodiment of the present invention, the shutter portion 42 is disposed on the side opposite to the carrier 16 of the opening portion 41a of the frame 41. The shutter portion 42 is provided with a shielding portion which can partially open and close a portion thereof. In addition, the load port 40 is configured to further include a shutter drive unit for partially opening and closing a portion of the shielding portion and a purge nozzle for supplying a purge gas to the inner portion of the carrier 16 of the FOUP 13. In this specification, a configuration including a plurality of the shielding plates 43 as a shielding portion is exemplified, and as a shutter drive unit, a shielding plate drive unit 44 which can move the shielding plate 43 upward and downward in the vertical direction is exemplified. The purge nozzle will be described later. Herein, the purge gas referred to in the present invention is a gas replacing the atmosphere inside the carrier 16 of the FOUP 13 and includes a dry air as well as nitrogen, argon, neon, krypton.

The frame 41 of the load port 40 according to an embodiment of the present invention is attached to a base member 45 through the bracket 41b at a position closer to the transfer robot 4 than the FIMS door 12 as viewed from the stage 14 side. The frame 41 is a plate-shaped member having a thickness of 5 to 10 mm and is disposed so as to cover the entire periphery of the port opening portion 11. Furthermore, an opening portion 41a is formed in the frame 41, and the opening portion 41a has the same area and shape as those of the opening portion 16a of the carrier 16. The transfer robot 4 passes through the opening portion 41a of the frame 41 and the opening portion 16a of the carrier 16 to load the wafer 15 into each shelf 18 formed inside the carrier 16 or to unload the wafer 15 mounted on each shelf 18 out of the carrier 16. Herein, the opening portion 16a formed in the carrier 16 of the FOUP 13 is used as the first opening portion, and the opening portion 41a formed in the frame 41 is used as the second opening portion. A seal member 46 is attached to the peripheral edge of the opening portion 41a of the frame 41 which is the second opening portion over the entire periphery. The seal member 46 is disposed so as to be hermetically in contact with the flange portion 26 formed on the peripheral edge of the opening portion 16a which is the first opening portion formed in the carrier 16 which has moved forward to the wafer delivery position. Furthermore, the seal member 46 can suppress dust generated when the frame 41 and the flange portion 26 are in contact with each other. It is preferable that the seal member 46 is made of an elastic body such as a rubber, silicon, or urethane foam which is excellent in airtightness and cushioning property.

The frame 41 is fixed to the base member 45 of the load port 40 through the bracket 41b. The bracket 41b serves as a spacer, and thus, the frame 41 is fixed to the base member 45 with a predetermined space therebetween, so that the frame 41 is prevented from colliding with each member such as the FIMS door 12 and the mapping sensor 32. A shield cover 48 is fixed between the peripheral edge of the opening portion 41a of the frame 41 and the base member 45 so as to close the gap. The gap between the frame 41 and the base member 45 is hermetically closed by the shield cover 48. However, since the FIMS door 12 and the mapping sensor 32 pass through the gap below the opening portion 41a, the shield cover 48 is not disposed. In addition, the shield cover 48 may be provided with side surface purge nozzles 49 for supplying a purge gas to the space covered with the shield cover 48 and the internal space of the carrier 16. The side surface purge nozzles 49 and the purge gas supply path to the side surface purge nozzles 49 will be described later.

The stage drive unit 47 provided in the load port 40 is configured to include a motor 47a as a drive source and a feed screw 47b. The rotation of the motor 47a is transmitted to the feed screw 47b, so that the stage 14 fixed to the feed screw 47b can be moved to an arbitrary position. The stage drive unit 47 is configured to move forward and backward at the standby position (position of FIG. 5) that is the first position where the FOUP 13 is exchanged with the outside, the dock position that is the second position where the stage 14 is moved forward to allow the FIMS door 12 and the lid 17 to be in contacted and integrated with each other, and the transfer position (position of FIG. 6) that is the third position where the carrier 16 and the lid 17 as the main body of the FOUP 13 are separated from each other, and after that, the wafer 15 is exchanged with the transfer robot 4. The third position is a position where the flange portion 26 formed on the carrier 16 is in contact with the frame 41 by further moving the stage 14 forward from the dock position that is the second position. Instead of the motor 47a and the feed screw 47b, the stage drive unit 47 may be provided with a cylinder using a fluid pressure such as an air pressure or a hydraulic pressure. In addition, similarly to the load port 2 of the related art, the FOUP 13 is configured to be accurately mounted at a predetermined position of the stage 14 by the kinematic pins 30 provided on the stage 14 as positioning members and to be engaged with the stage 14 by an engagement means (not shown).

In the load port 40 of the embodiment, the stage 14 is provided with a bottom surface purge nozzle 66. The bottom surface purge nozzle 66 is provided to supply a purge gas to the inner portion of the carrier 16. When the carrier 16 is positioned at the predetermined position of the stage 14 by the kinematic pins 30, the bottom surface purge nozzle 66 is disposed at a position corresponding to the purge ports 39a and 39b provided at the bottom portion of the carrier 16. The purge gas is supplied to the inner portion of the space that accommodates the wafer 15 surrounded by the carrier 16 and the shutter portion 42 through the bottom surface purge nozzle 66.

Figure 7:
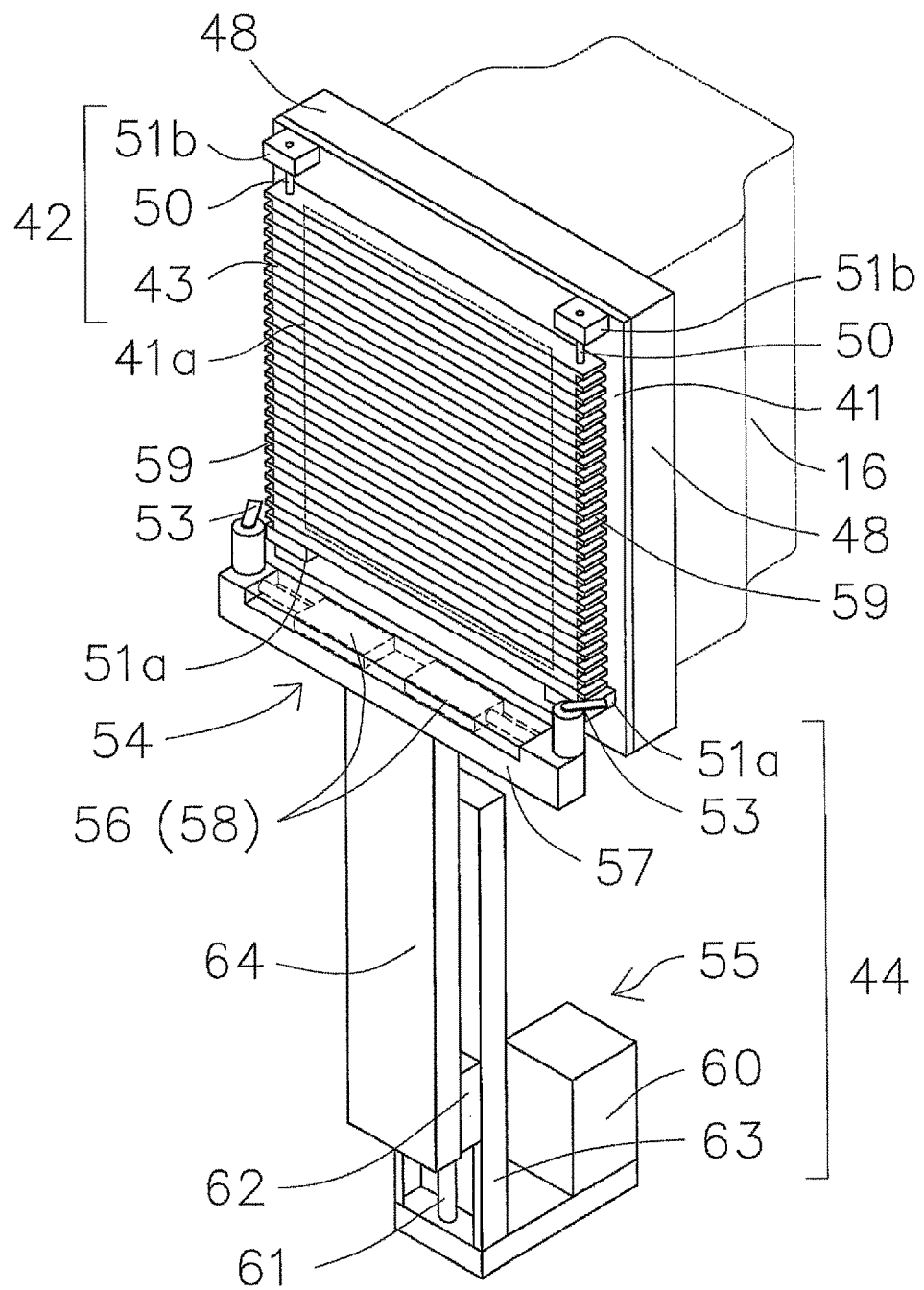
FIG. 7 is a schematic perspective diagram illustrating a vicinity of the shutter portion.
Figure 8:
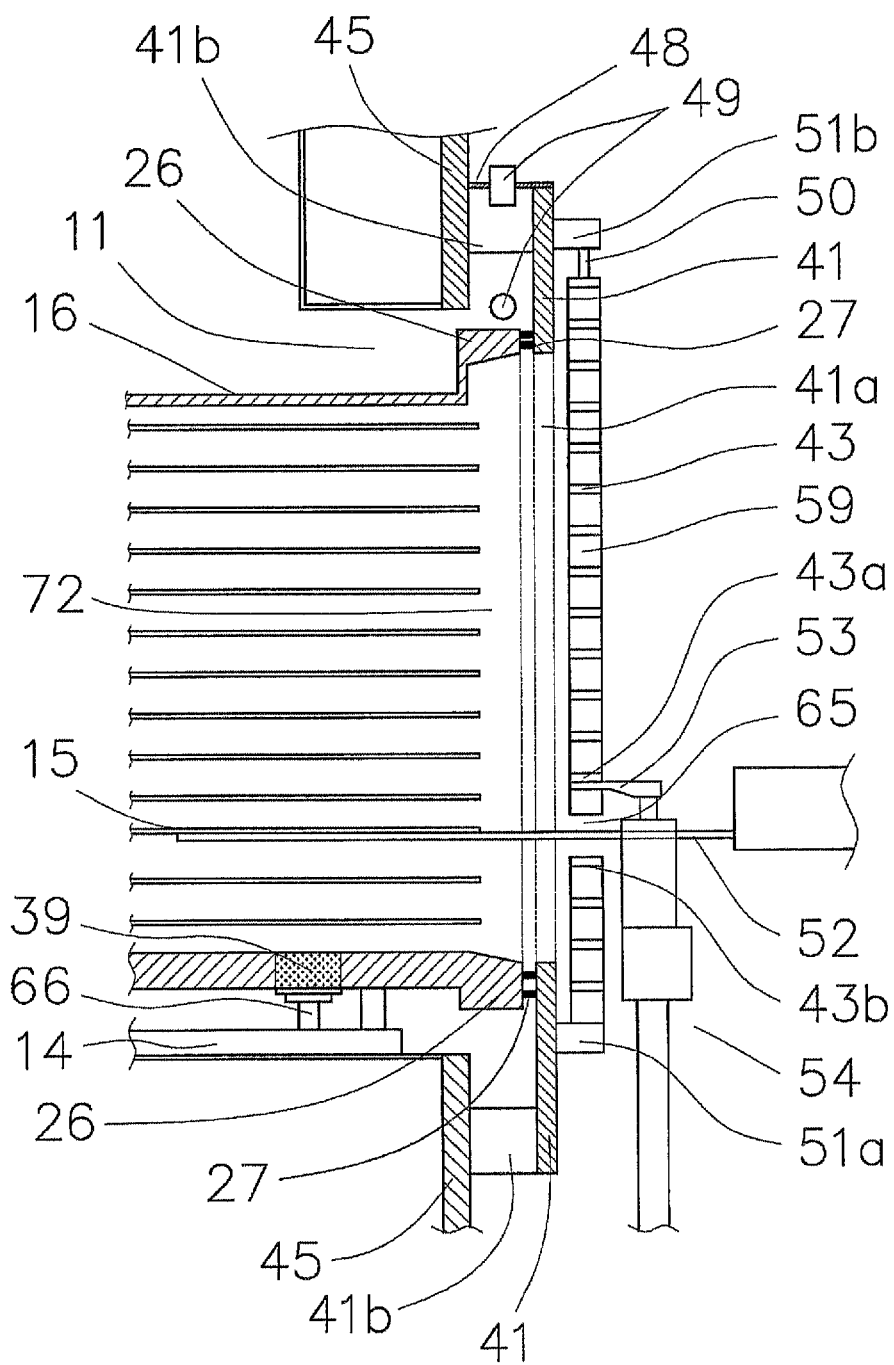
FIG. 8 is a cross-sectional diagram of the vicinity of the shutter portion as viewed from the side.

Next, a plurality of the shielding plates 43 and a shutter portion 42 for closing the opening portion 41a that is the second opening portion provided in the frame 41 will be described with reference to FIGS. 6, 7, and 8. FIG. 7 is a schematic perspective diagram illustrating the vicinity of the shutter portion 42, and FIG. 8 is a partially enlarged cross-sectional diagram of the vicinity of the shutter portion 42 as viewed from the side. The shielding plate 43 is configured as a prismatic member of which longitudinal dimension is larger than the horizontal length of the opening portion 41a provided in the frame 41. In addition, each shielding plate 43 has a dimension (thickness) in the height direction that is substantially equal to the vertical interval of each shelf 18 formed inside the FOUP 13. The shielding plates 43 are disposed in a stacked state in the vertical direction, so that the opening portion 41a formed in the frame 41 is closed by a plurality of the stacked shielding plates 43. Through-holes are provided in the vertical direction near the left and right end portions of each shielding plate 43. A positioning shaft 50 which is a cylindrical member for regulating the horizontal position of the shielding plate 43 is inserted into each through-hole. A pair of the positioning shafts 50 are disposed parallel to each other at a distance so that the wafer 15 horizontally supported on at least the fingers 52 can pass through. In addition, fixing blocks 51a and 51b are attached to the upper and lower ends of each of the left and right positioning shafts 50, and furthermore, the fixing blocks 51a and 51b are fixed to the frame 41.

The fixing blocks 51a and 51b are fixed to the surface of the frame 41 opposite to the carrier 16 side (the side on which the transfer robot 4 is disposed). In addition, the diameter of the through-hole opened in each shielding plate 43 is slightly larger than the diameter of the positioning shaft 50. Each shielding plate 43 is supported so as to be movable in the vertical direction in the state where the shielding plate is stacked on the fixing block 51a fixed to the lower side of the opening portion 41a of the frame 41. The upper fixing block 51b is fixed upward at a predetermined distance with respect to the upper surface of the shielding plate 43 disposed at the uppermost stage. With the configuration, each of the shielding plates 43 can be lifted upward from any position, and if a predetermined shielding plate 43a is lifted, the entire shielding plate 43 stacked above the predetermined shielding plate 43a can be lifted upward.

As illustrated in FIG. 8, if a predetermined shielding plate 43a is lifted upward, a gap locally appears between the shielding plate 43a and the shielding plate 43b located immediately below the lifted shielding plate 43a. The gap serves as an opening portion 65 through which the wafer 15 and the finger 52 supporting the wafer 15 can pass. Herein, the shielding plates 43 located below the lifted shielding plate 43a are stopped in a stacked state, and, the shielding plates 43 located above the shielding plate 43a are moved upward integrally with the shielding plate 43a in the stacked state. Therefore, the third opening portion 65 which is narrower than the opening portion 41a formed in the frame 41 appears. In the area of the opening portion 41a, portions other than the third opening portion 65 remain closed by a plurality of the shielding plates 43. In addition, each shielding plate 43 is disposed with a slight gap on the side of the transfer robot with respect to the frame 41 so as not to be in contact with the frame 41. Therefore, when the shielding plates 43 are moved upward and downward along the positioning shaft 50 in the vertical direction, the shielding plate 43 and the frame 41 are not in contact with each other, and thus, dust caused by contact does not occur.

When the transfer robot 4 is to access the wafer 15 in the carrier 16, the accessing is performed through the opening portion 65. In the opening portion 65, the vertical position thereof is determined by the lower side of the lifted shielding plate 43*a* and the upper side of the shielding plate 43*b* immediately below the shielding plate 43*a*. Therefore, it is preferable that the respective shielding plates 43 in the closed state are positioned so that the positions thereof correspond to the height of the shelf plate 18 formed on the carrier 16 fixed to the stage 14. For example, the shielding plates may be disposed so that the upper surface of each shelf plate 18 and the upper or lower surface of the shielding plate 43 facing the shelf plate 18 are at the same height position in the vertical direction, or the shielding plates may be disposed so that the upper or lower surface of the shielding plate 43 facing the upper surface of each shelf plate 18 is shifted in the vertical direction by a predetermined dimension. In particular, for the purpose of maintaining the internal atmosphere of the carrier 16, by taking into consideration a thickness dimension of the fingers 52 of the transfer robot 4, an amount of deflection of the wafer at the time of being supported by the fingers 52 and passing through the opening portion, and the like, it is preferable that the opening portion 65 is regulated so as to have an opening area as small as possible.

Next, the shielding plate drive unit 44 for moving the shielding plate 43 upward and downward in the vertical direction will be described with reference to FIG. 7. The shielding plate drive unit 44 is configured to include a shielding plate support mechanism 54 having hooks 53 at left and right ends thereof and an elevation drive mechanism 55 for moving the shielding plate support mechanism 54 upward and downward in the vertical direction.

The shielding plate support mechanism 54 is configured to include hooks 53 which are engaged with notched portions 59 formed at both ends of the shielding plate 43 to support the shielding plate 43 at both ends, a hook drive means 56 for engaging the hooks 53 with the notched portions 59 by rotating the hooks 53 in a horizontal plane, and a support member 57 for supporting the hook drive means 56. The hook 53 has a shape and dimension such that the distal end portion thereof can be engaged with the notched portion 59 of the shielding plate 43, and the other end thereof is connected to a driving shaft of the hook drive means 56. For example, the hook drive means 56 can use the air cylinder 58 as a drive source. The extending and contracting motions of a cylinder rod of the air cylinder 58 is converted into the rotational motion of a pair of the hooks 53 by a pair of cam mechanisms or link mechanisms disposed at both ends of the shielding plate support mechanism 54. The air cylinder 58, the cam mechanisms, and the like are operably supported by the support member 57. A compressed air is supplied to the air cylinder 58 through piping and control valves (not shown), so that the cylinder rod of the air cylinder 58 is extended. In addition, when a supply pressure is released by stopping supplying the compressed air, the cylinder rod is contracted by an elastic member or the like. The extending and contracting motions of the cylinder rod are converted into forward and reverse rotations of the hook 53 by the cam mechanism or the like.

In the embodiment, illustrated is the example where the air cylinder 58, the cam mechanisms, and the like are provided as the hook drive means 56, but the present invention is not limited thereto. For example, instead of the air cylinder 58, a motor or an electromagnet may be used, or the hook 53 may be rotated on a rotating shaft of the motor or the rotary actuator. Furthermore, in the embodiment, the hooks 53 are configured to be engaged with the notched portions 59 by rotating the hooks. However, alternatively, the hooks 53 may be configured to be engaged with the notched portions 59 by sliding the hooks 53.

Next, the configuration of the elevation drive mechanism 55 that moves the shielding plate support mechanism 54 upward and downward in the vertical direction will be described. The elevation drive mechanism 55 is configured to include a motor 60 as a drive source and a feed screw 61. When the motor 60 is rotated, the rotation of the motor 60 is transmitted to the feed screw 61 with a predetermined reduction ratio through a pulley and a belt (not shown). Therefore, the feed screw is rotated, and a mover 62 screwed onto the feed screw is moved upward and downward. It is preferable that the motor 60 of the elevation drive mechanism 55 of the embodiment is a stepping motor or a servomotor of which angle of the motor shaft can be controlled by pulses. The elevation drive mechanism 55 is provided with a guide means 63 for guiding the movement of the mover 62 to a linear movement in the vertical direction. The lower portion of the supporting plate 64 is fixed to the mover 62, and the top portion of the supporting plate 64 is attached to the bottom portion of the support member 57 of the shielding plate support mechanism 54 to support the support member 57 from below. Therefore, by controlling the rotation angle of the motor 60, while both ends of the predetermined shielding plate 43 can be supported by the hooks 53, the shielding plate can be moved upward and downward.

In this configuration, in order to open and close the third opening portion 65, it is necessary that the shielding plate 43 can be moved in the vertical direction. Therefore, the opened/closed amount of the third opening portion 65 is defined by the interval between the upper-end fixing block 51*b* and the uppermost stage shielding plate 43. Therefore, by setting the interval to be sufficiently large, the vertical movement amount can be increased. Namely, by increasing the interval, it is also possible to allow the opening-portion height of the third opening portion 65 to be equal to or larger than the distance between the shelf plates or the pitch of the shielding plates.

Furthermore, when the elevation drive mechanism 55 is moved downward, the shielding plate 43 is moved downward due to its own weight, so that the third opening portion 65 is closed. Herein, in order to reliably close the third opening portion 65, a coil spring (not shown) is provided between the upper-end fixing block 51*b* and the uppermost shielding plate 43, and by pressing the coil spring downward, it is possible to reliably close the third opening portion. Furthermore, instead of the coil spring, a leaf spring, a rubber, or other elastic member may be configured to be used to press the uppermost shielding plate 43 downward.

In the above description, illustrated is the example where the shutter portion 42 is configured to include the shielding plates of which the number is equal to the number of the shelf plates at the positions corresponding to the positions of a plurality of the shelf plates. However, the shutter portion 42 may be configured to include the shielding plates 43 of which the number is smaller than the number of the shelf plates.

In addition, the shielding plate drive unit 44 can perform loading and unloading of the substrate with an extremely small opening portion by opening and closing the third opening portion so as to be the same height as the area of each shelf portion accommodating one substrate described above. However, it is also possible to change the size of the third opening portion by changing the vertical movement amount of the shielding plate by using the shielding plate drive unit 44. For example, the size of the third opening portion may be configured to be selectively opened and closed so that the vertical movement amount of the shielding plate drive unit 44 is set to be the same height as the area of each shelf portion accommodating one substrate or to be the height which is an integral multiple of the height.

Figure 9:
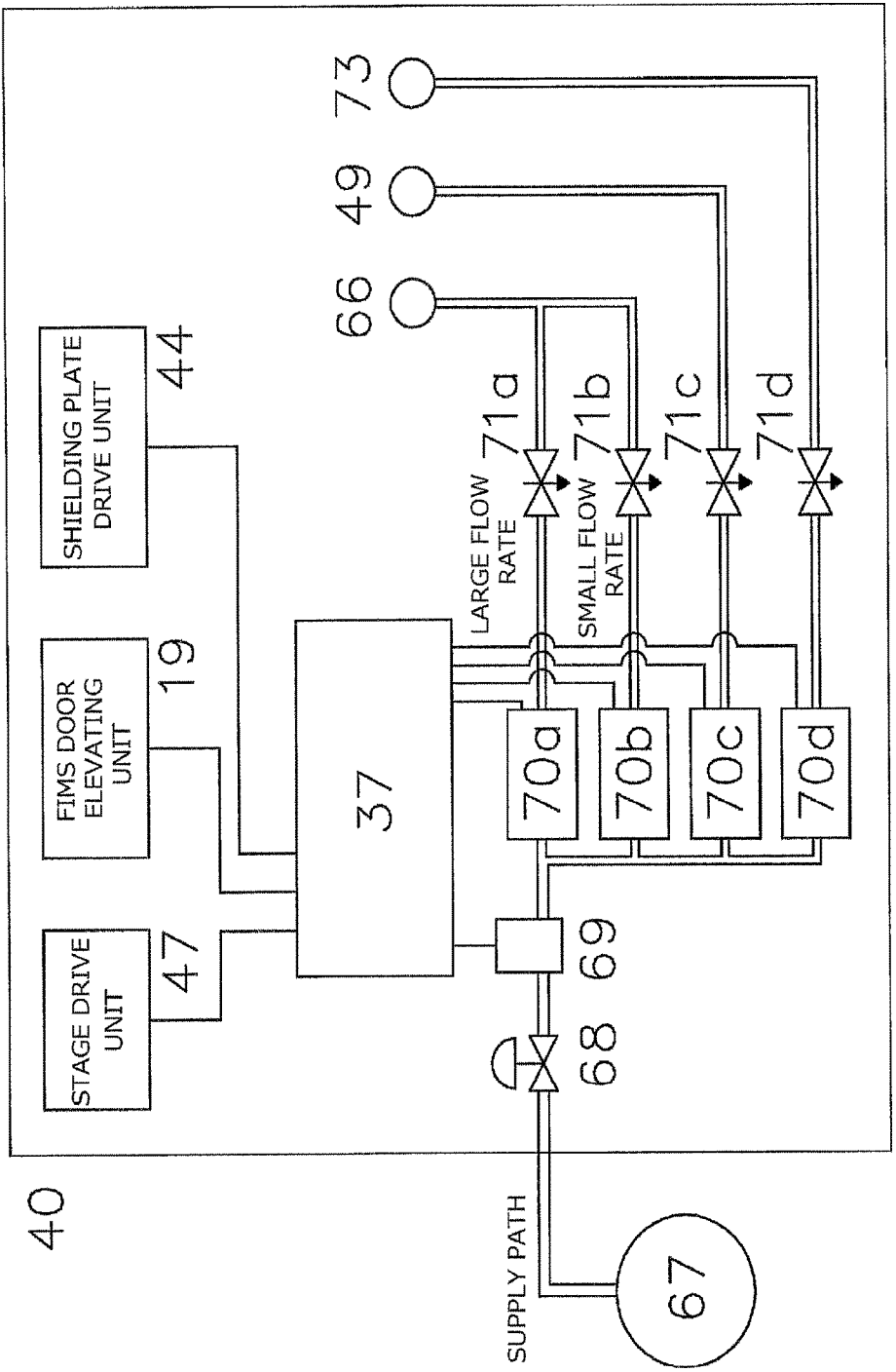
FIG. 9 is a diagram illustrating a control system of a control unit.

The control unit for controlling the various drive units 44 and the load port of the present invention described above will be described with reference to FIG. 9. The operations of the stage drive unit 47, the FIMS door elevating unit 19, and the shielding plate drive unit 44 are controlled by a control unit 37 provided in the load port 40. Furthermore, the control unit 37 also performs switching control of supply timing and supply amount of the purge gas. The purge gas introduced into each of the purge nozzles 66, 49, and 73 (the purge nozzle 73 will be described later) may be configured to be supplied from factory facilities where the hybrid processing apparatus 1 (FIG. 1) is installed, and the purge gas may be configured to be supplied from a container storing the purge gas, which is installed in the hybrid processing apparatus 1. The purge gas supplied from the supply source 67 is introduced into the load port 40 through a supply path and is distributed to four systems by using the pressure regulator 68 and the pressure sensor 69 through the piping provided in the load port 40. The purge gases distributed to the four systems are introduced into the respective purge nozzles 66, 49, and 73 through the piping by using electromagnetic valves 70a to 70d and flow rate regulating valves 71a to 71d provided in the respective systems. The pressure regulator 68 regulates the pressure of the outlet side (load port side) to be constant with respect to pressure fluctuation of the inlet side generated by the supply source 67. The pressure sensor 69 measures the pressure of the purge gas supplied from the pressure regulator 68. In the case where the purge gas is in a high pressure state or a low pressure state with respect to preset upper and lower threshold values of the pressure value, the pressure sensor transmits an alarm signal to the control unit 37.

The electromagnetic valves 70a to 70d control the supply of the purge gas by opening and closing a valve through which the purge gas flows according to a signal transmitted from the control unit 37. The control unit 37 transmits opening/closing signals of the valves to the electromagnetic valves 70a to 70d according to a procedure stored in advance in the storage device provided inside the control unit, so that it is possible to supply the purge gas for a predetermined period at a predetermined timing. The flow rate regulating valves 71a to 71d are provided in the piping paths connected from the respective electromagnetic valves 70a to 70d to the respective purge nozzles, so that the flow rate of the purge gas can be accurately regulated by the flow rate regulating valves 71a to 71d. In the load port 40 of the embodiment, two systems of the electromagnetic valve 70a and the flow rate regulating valve 71a for controlling the flow rate of a large-flow-rate purge gas and the electromagnetic valve 70b and the flow rate regulating valve 71b for controlling the flow rate of a small-flow-rate purge gas are provided for the bottom surface purge nozzle 66, and one system of the electromagnetic valve 70c and the flow rate regulating valve 71c for supplying a predetermined purge gas is provided for the side surface purge nozzles 49. With the above-described configuration, the purge gas introduced into the load port 40 can be regulated to a predetermined pressure and flow rate, and after that, the purge gas can be supplied to each purge nozzle at a predetermined timing for a predetermined period.

Figure 10A:
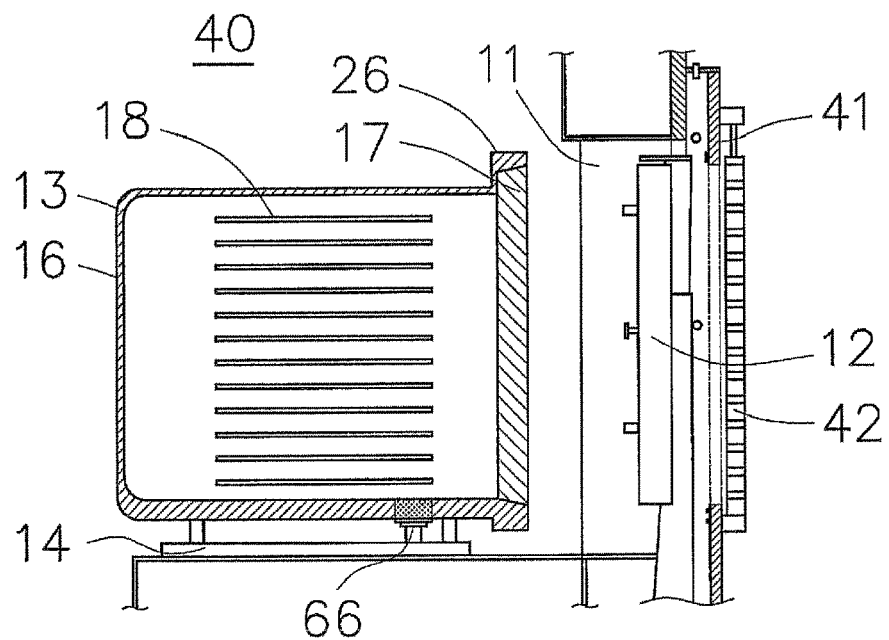
FIG. 10A is a cross-sectional side view showing a state in which a stage is at a first position (standby position)
Figure 10B:
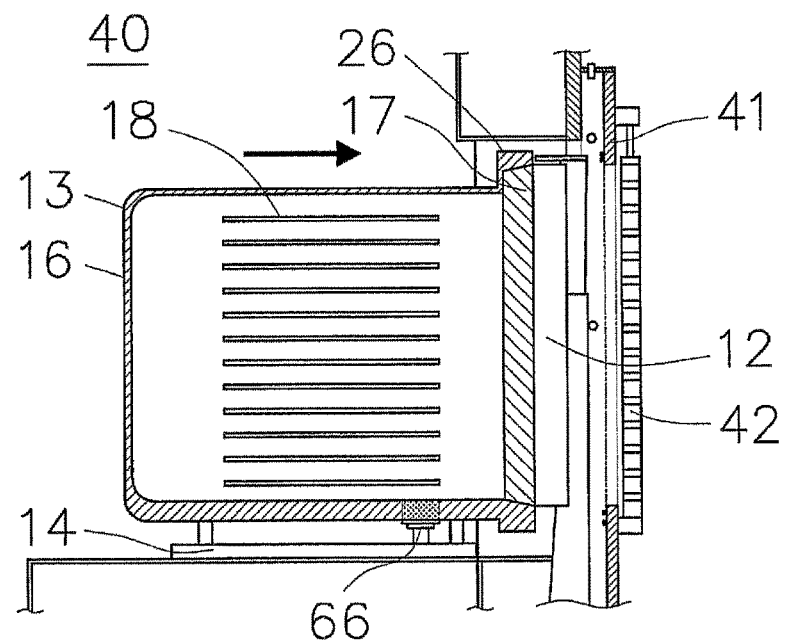
FIG. 10B is a cross-sectional side view showing a state in which a stage is at a second position (dock position)
Figure 11A:
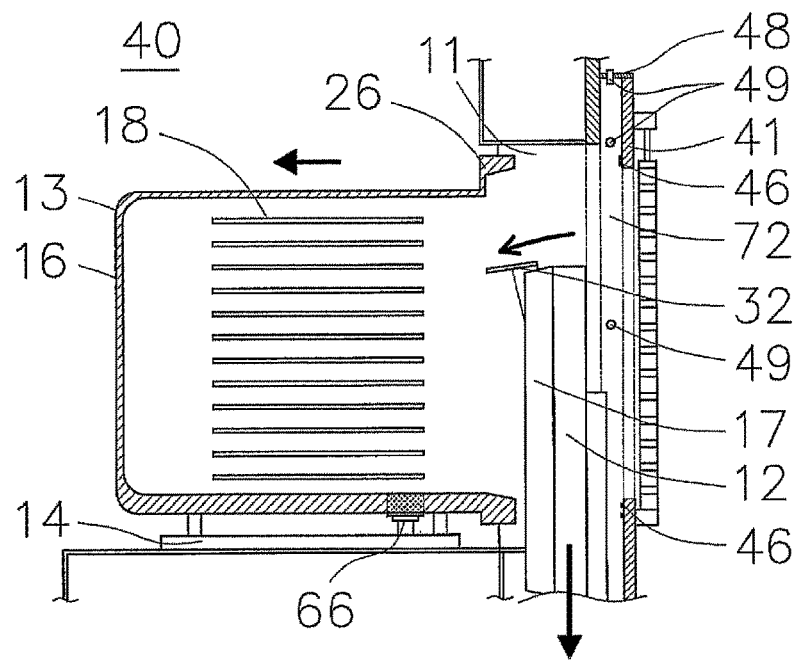
FIG. 11A is a cross-sectional side view showing a state in which the stage is at a mapping position.
Figure 11B:
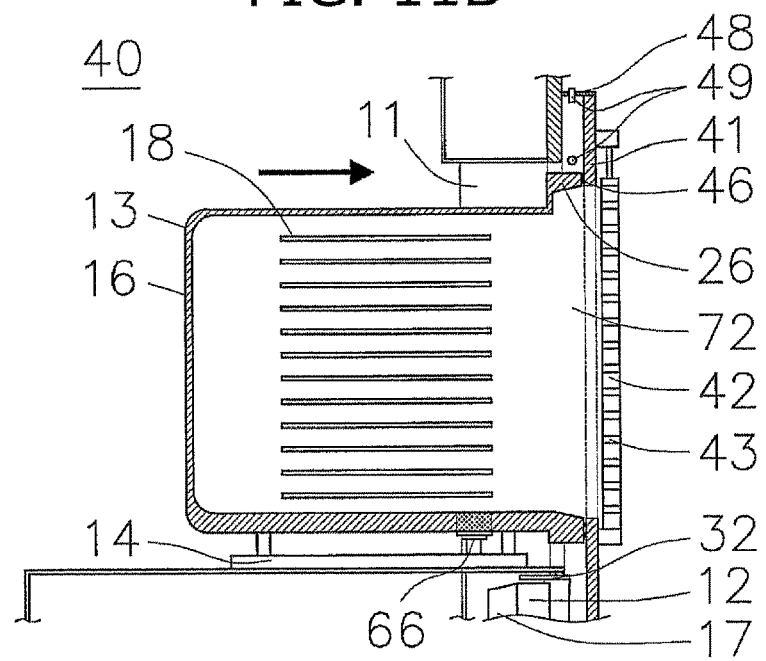
FIG. 11B is a cross-sectional side view showing a state in which the stage is at a third position (transfer position)

Next, the operation of the load port 40 according to the embodiment of the present invention will be described in detail with reference to FIGS. 10A, 10B, 11A and 11B. FIG. 10A is a diagram illustrating a state where the stage 14 is in the standby position that is the first position, and FIG. 10B is a diagram illustrating a state where the stage 14 is in the second position (dock position) that is in the back side from the first position and the FIMS door 12 and the lid 17 are integrated with each other. FIG. 11A is a diagram illustrating a state where the stage 14 is moved slightly backward from the second position toward the standby position and is moved to the mapping position, the integrated FIMS door 12 and the lid 17 are removed from the carrier 16, and the FIMS door 12 and the lid 17 together with the mapping sensor 32 are moved downward. FIG. 11B is a diagram illustrating a state where the stage 14 is further moved forward to the back side from the second position and after that, moved to the transfer position that is the third position.

When the empty FOUP 13 is mounted on the stage 14 which stands by at the first position illustrated in FIG. 10A in order to receive the wafer 15 having undergone the surface treatment in the hybrid processing apparatus 1, the control unit 37 fixes the FOUP 13 to the stage 14. After that, the stage drive unit 47 is driven to move the stage 14 to the dock position that is the second position illustrated in FIG. 10B. When the movement to the second position is completed, the control unit 37 operates the respective mechanisms of the FIMS door 12 to integrate the FIMS door 12 and the lid 17 and to release the locked state of the lid 17 and the carrier 16. Next, as illustrated in FIG. 11A, the control unit 37 retracts the stage 14 to separate the lid 17 from the carrier 16. When the retraction movement of the stage 14 is completed, the FIMS door 12 and the mapping sensor 32 are slightly moved downward in the vertical direction, and after that, the mapping sensor 32 is moved toward the carrier 16. When the mapping sensor 32 is moved toward the carrier 16, the control 37 allows the stage 14 to move forward to the second position that is the dock position again. In addition, in the load port 40 of the embodiment, the carrier 16 is configured to be retracted when the carrier 16 and the lid 17 are separated from each other, but the present invention is not limited thereto. The FIMS door 12 integrated with the lid 17 may be retracted with respect to the carrier 16.

Next, the control unit 37 detects the wafer 15 by moving the FIMS door 12 and the mapping sensor 32 downward in the vertical direction down to a predetermined position, and it is checked whether or not the wafer 15 is mounted on the shelf plate 18 inside the carrier 16. When the detection is completed, the control unit 37 retracts the mapping sensor 32 to its original standby position and lowers the FIMS door 12 and the mapping sensor 32 down to a downward-movement position where the FIMS door and the mapping sensor do not interfere with the stage 14.

When the downward-movement operation of the FIMS door 12 and the mapping sensor 32 is completed, as illustrated in FIG. 11B, the control unit 37 further moves the stage 14 forward from the dock position that is the second position toward the frame 41 disposed in front of the dock position and moves the stage to the transfer position that is the third position. When the stage 14 is moved forward to the third position, the flange portion 26 of the carrier 16 and the seal member 46 of the frame 41 are hermetically in contact with each other. Since the load port 40 according to the embodiment of the present invention is not provided with the flange panel 8 (refer to FIG. 3) which is provided to the load port 2 of the related art in the vicinity of the port opening portion 11, the flange portion 26 of the carrier 16 can pass through the port opening portion 11 to be moved forward to a predetermined position without being interfered with any member.

While the movement from the second position to the third position is completed, the control unit 37 opens the electromagnetic valve 70a and supplies a large-flow-rate purge gas into the carrier 16 through the bottom surface purge nozzle 66. Furthermore, the control unit 37 operates the electromagnetic valve 70c to supply the purge gas into the wafer storage space 72 surrounded by the carrier 16, the shield cover 48, the frame 42, and the shutter portion 42 through the side surface purge nozzles 49. The supplied purge gas fills the inner portion of the wafer storage space 72, and thus, the general atmosphere inside the wafer storage space 72 is pushed out by the purge gas so that the general atmosphere inside the wafer storage space is discharged to the outside from the gap provided between the each shielding plate 43 of the shutter portion 42 and the frame 42. By doing so, the atmosphere replacement in the wafer storage space 72 is performed. For example, in the case where it takes a long time to replace the atmosphere because the volume of the FOUP 13 is large or in the case where the supply amount of the purge gas cannot be increased, immediately after the FOUP 13 is fixed to the first position of the stage 14, the supply of the purge gas may be started. However, in this case, since the FOUP 13 is hermetically sealed, it is preferable that the purge gas is supplied through the injection purge port 39a and the internal atmosphere of the FOUP 13 is discharged through the discharge purge port 39b. By doing so, the atmosphere replacement can be completed in a short time.

When the movement of the stage 14 to the transfer position that is the third position is completed, the carrier 16 and the frame 42 are hermetically in contact with each other, and the control unit 37 closes the electromagnetic valve 70c so that the supplying the purge gas from the side surface purge nozzles 49 is stopped. Furthermore, when a predetermined time has passed after the movement of the stage 14 to the third position is completed, the control unit 37 closes the electromagnetic valve 70a for controlling the supply of the large-flow-rate purge gas to the bottom surface purge nozzle 66 and instead, opens the electromagnetic valve 71b for controlling the supply of the small-flow-rate purge gas, so that the supply of the small-flow-rate purge gas to the purge nozzle 66 is started. The supply of the small-flow-rate purge gas to the wafer storage space 72 is continuously performed, and thus, the environment of the inner portion thereof is maintained to be clean. In addition, in the above description, the FOUP 13 that does not accommodate the wafers 15 is used, but the present invention is not limited thereto. The load port 40 may be configured such that the FOUP 13 accommodating the wafers 15 to be processed by the hybrid processing apparatus 1 is mounted and may be allowed to stand by at the transfer position by opening the lid 17 thereof. Even in this case, the internal atmosphere of the wafer storage space 72 may be replaced with the purge gas in accordance with the above-described procedure.

When the above-described operations are completed, the control unit 37 transmits a preparation complete signal for transfer of the wafer 15 to an upper-level control means (not shown). The upper-level control means which has received the signal transmits an instruction signal to the transfer robot 4 to transfer the wafer 15 which has undergone a predetermined process, from the process chamber 7 to the load port 40. Furthermore, the upper-level control means transmits, to the control unit 37, a signal (access request signal) to notify that the wafer 15 is going to be transferred to designated shelf plate 18. The control unit 37 that has received the access request signal activates the shielding plate drive unit 44 to move the shielding plate 43 corresponding to the designated shelf plate 18 upward. At this time, by moving the shielding plate 43 upward, there is a possibility that the purge gas is discharged from the third opening portion 65 to the outside and the concentration of the purge gas inside the wafer storage space 72 is decreased. In order to prevent the problem, the control unit 37 operates the electromagnetic valves 70a and 70b to switch the flow rate of the purge gas supplied into the wafer storage space 72 from the small flow rate to the large flow rate, so that the concentration of the purge gas inside the wafer storage space 72 can be prevented from being decreased.

Figure 12A:
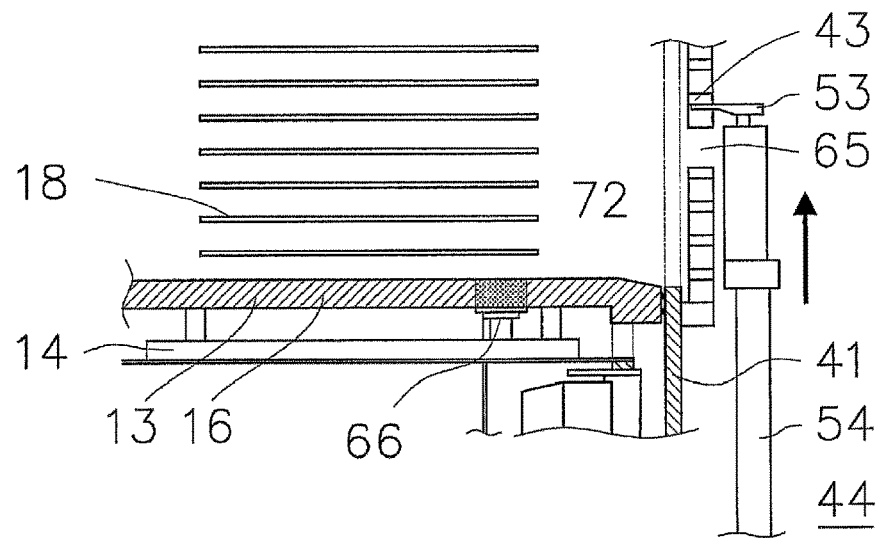
FIG. 12A is a partial cross-sectional side view showing shielding plates in which one of the shielding plates is opened by the shielding plate drive unit.

Next, in the load port 40 according to the embodiment of the present invention, the procedure of putting the wafer 15 of which surface treatment has been completed by the hybrid processing apparatus 1 into inside of the FOUP 13 and the control of the supply of the purge gas will be described. First, the lid 17 of the FOUP 13 where the wafer 15 is not contained is opened on the basis of the above-described operation procedure of the load port 40, and the inner portion of the wafer storage space 72 is filled with the purge gas. The wafer 15 of which the surface treatment has been completed is picked up from the hybrid processing apparatus 1 by the transfer robot 4. At this time, the upper-level control means transmits, to the control unit 37, a transfer instruction signal instructing to transfer the wafer to the predetermined shelf plate 18 of the carrier 16. The control unit 37 that has received the instruction signal activates the shielding plate drive unit 44. The shielding plate drive unit 44 moves the shielding plate support mechanism 54 upward to a predetermined position and engages the hooks 53 with the notched portions 59 of the shielding plate 43 corresponding to the desired shelf plate 18, and after that, the shielding plate support mechanism 54 is moved upward to form the opening portion 65 which be accessible to a position corresponding to a desired shelf plate (refer to FIG. 12A). Herein, in order to prevent the concentration of the purge gas inside the wafer storage space 72 from being decreased due to the flow of the purge gas filling the inner portion of the wafer storage space 72, from the opening portion 65 to the outside of the space, the control unit 37 switches the operations of the electromagnetic valves 70a and 70b to start supplying a large-flow-rate purge gas to the wafer storage space 72.

Figure 12B:
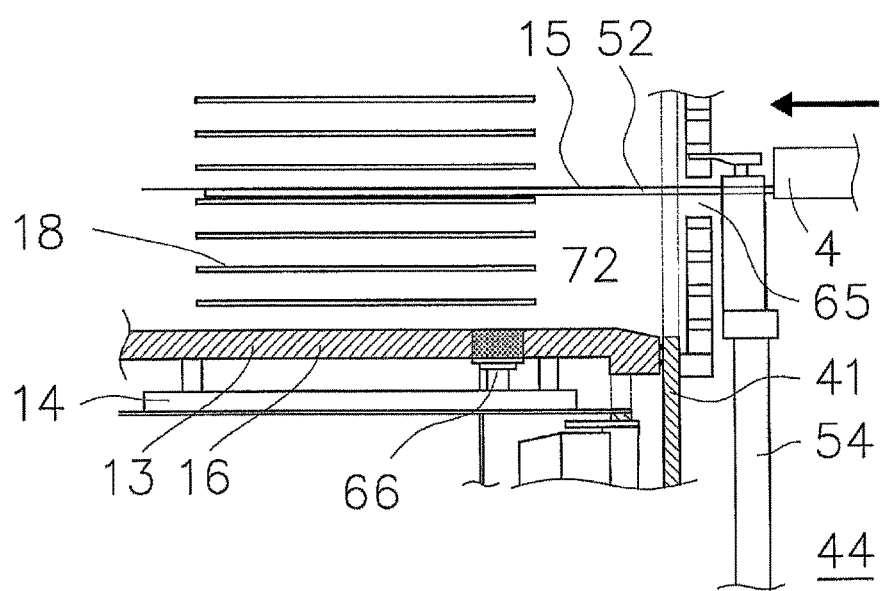
FIG. 12B is a partial cross-sectional side view showing a wafer loaded into the FOUP by the finger of the robot arm from the opening.
Figure 13A:
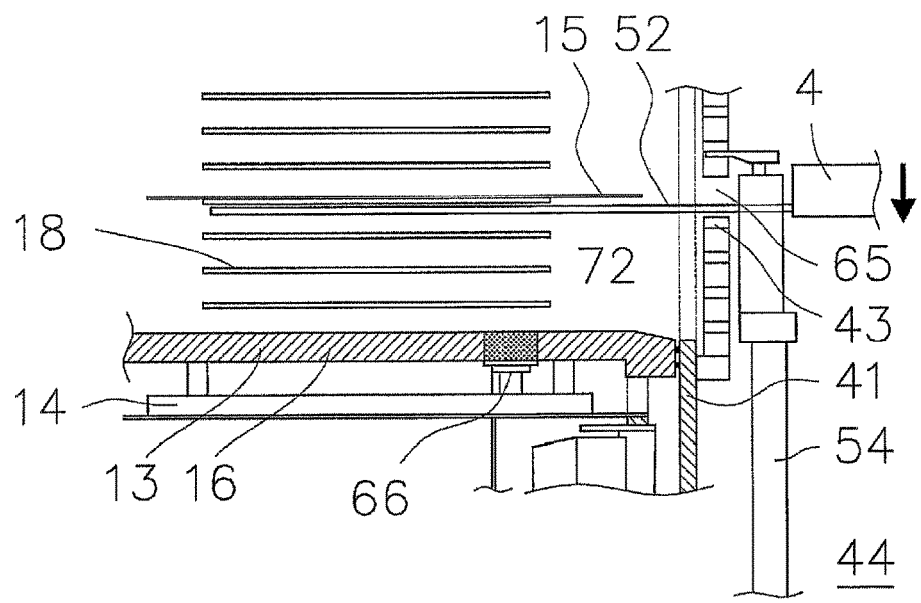
FIG. 13A is a cross-sectional side view showing a state of the wafer being mounted on the shelf by the finger moving down slightly.

When the above operation is completed, the control unit 37 transmits a reception preparation complete signal of the wafer 15 to the upper-level control means. The upper-level control means that has received the signal activates the transfer robot 4 to move the finger 52 and the wafer 15 retained by the finger 52 to a predetermined transfer position of a predetermined shelf plate specified in advance through the opening portion 65 (refer to FIG. 12B). When the horizontal movement is completed, the transfer robot 4 is slightly moved downward and mounts the wafer 15 retained by the finger 52 on a target shelf plate 18 (refer to FIG. 13A). In addition, since the opening portion 65 has a vertical dimension that does not interfere with a series of operations of the transfer robot 4, the wafer 15 and the finger 52 do not collide with the shielding plate 43. In addition, in the case where molecules of the reaction gas used in the hybrid processing apparatus 1 remain on the surface of the wafer 15 that is moved to the wafer storage space 72, the molecules of the reaction gas ride on the flow of the purge gas inside the wafer storage space 72, and thus, there is a possibility that the molecules of the reaction gas may diffuse into the wafer storage space 72. However, since the purge gas is always supplied and is discharged to the outside of the wafer storage space 72 through the gap between the opening portion 65 or the shielding plate 43 and the frame 41, the reaction gas does not remain within the wafer storage space 72, so that other wafers may not be contaminated. In addition, since the purge gas filling the wafer storage space 72 does not contain water molecules or oxygen molecules, no oxide film is generated on the surface of the wafer 15 loaded into the wafer storage space 72.

Figure 13B:
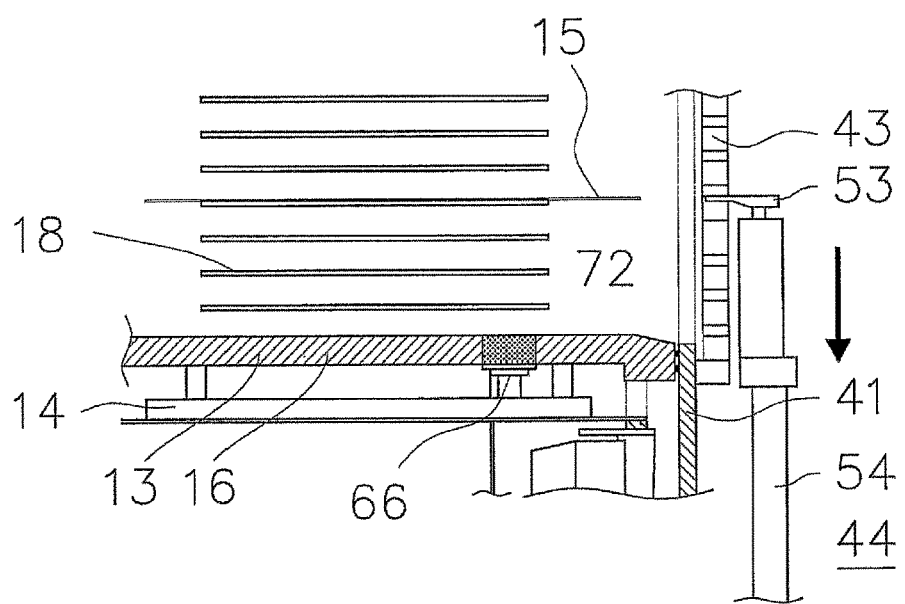
FIG. 13B is a partial cross-sectional side view showing the shielding plate being moved to the original position after the finger of the robot arm moving back.

When the operation of the transfer robot 4 is completed, the control unit 37 actuates the shielding plate drive unit 44 to move the shielding plate 43 to the original position (refer to FIG. 13B). After that, the engagement of the hook 53 is released, and the shielding plate drive unit 44 is moved to a predetermined standby position. Herein, when loading of the next wafer 15 is started, the control unit 37 maintains the operation of the electromagnetic valve 70a and continues to supply the large-flow-rate purge gas from the bottom surface purge nozzle 66. If the next wafer 15 is not loaded into, after a predetermined time has passed, the control unit 37 switches the operations of the electromagnetic valves 70a and 70b so that a small-flow-rate purge gas is supplied from the bottom surface purge nozzle 66 into the wafer storage space 72.

Figure 14A:
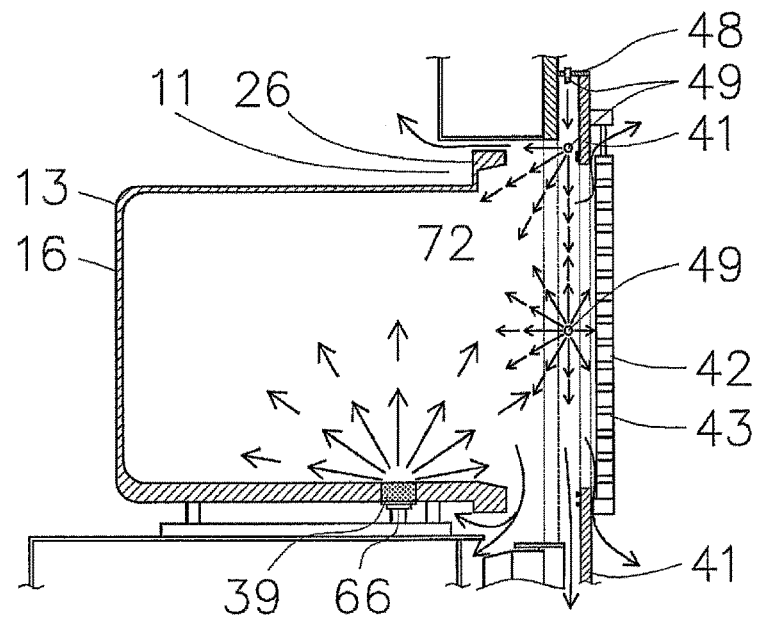
FIG. 14A is a cross-sectional side view showing the state of the inner portion of the carrier when purge gas is being supplied during the process of moving from the second position to the third position.
Figure 14B:
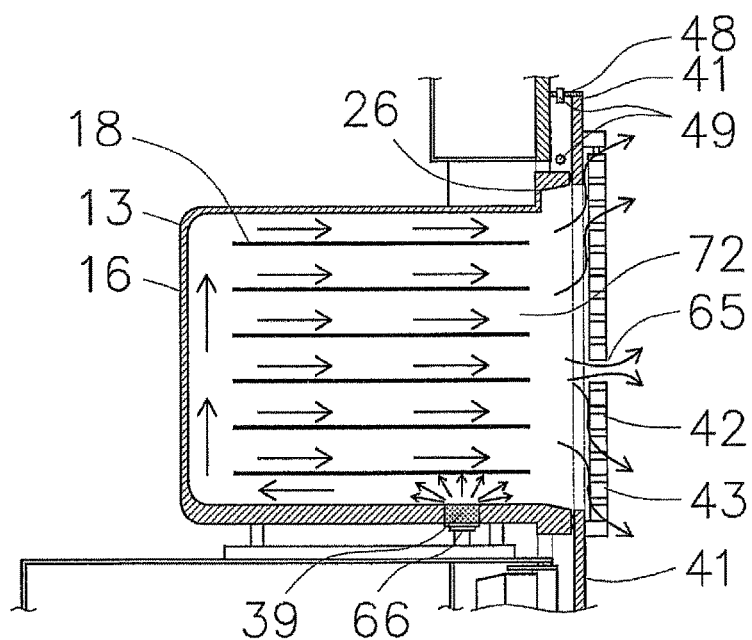
FIG. 14B is a cross-sectional side view showing the state of inner portion of the wafer storage space when purge gas is being supplied at the third position.
Figure 18:
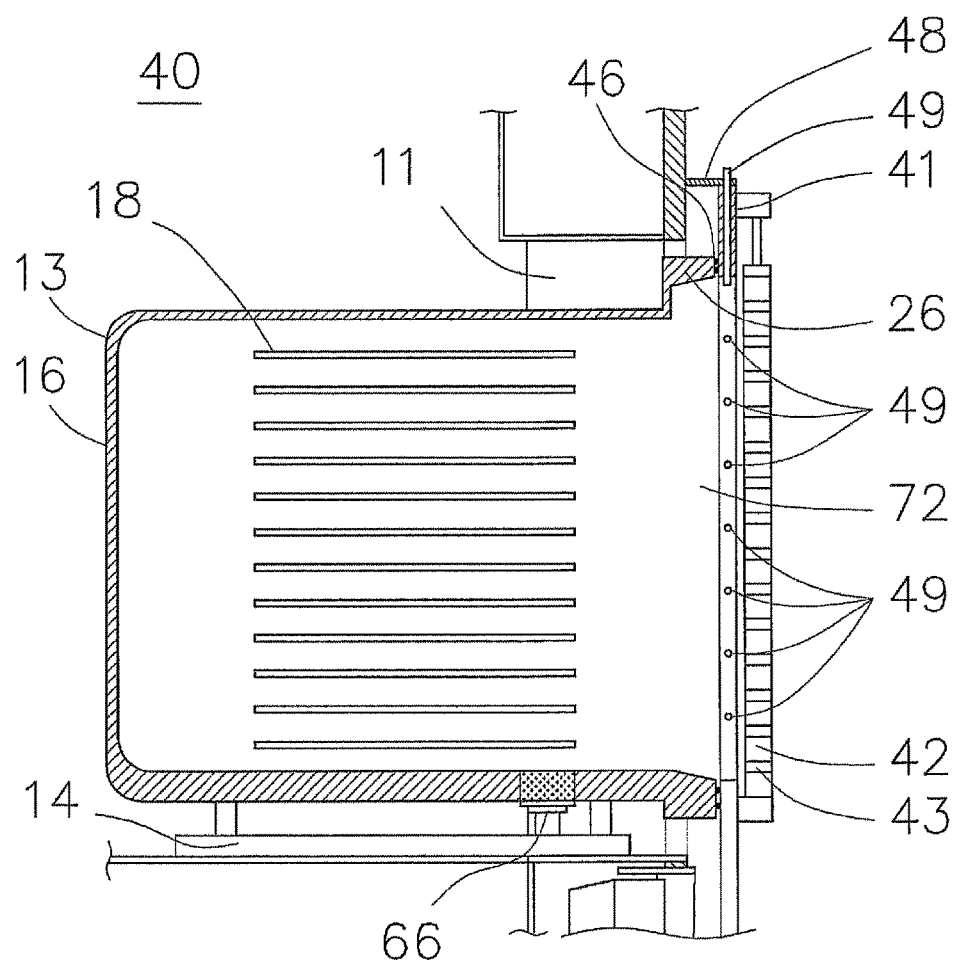
FIG. 18 is a diagram illustrating an example where a side surface purge nozzles is provided in a frame.

Next, the side surface purge nozzles 49 and the bottom surface purge nozzle 66 will be described in detail with reference to FIGS. 14A, 14B, and 18. FIG. 14A is a diagram illustrating a supply state of the purge gas during the process of moving from the second position to the third position, and FIG. 14B is a diagram illustrating a supply state of the purge gas at the third position. FIG. 18 is a diagram illustrating another example of the side surface purge nozzle. In order to effectively replace the internal atmosphere of the wafer storage space 72, it is important to discharge the general atmosphere staying inside the wafer storage space 72 by pushing the general atmosphere out by using the purge gas. If the purge gas is strongly supplied in order to supply a large amount of purge gas, the purge gas and the general atmosphere are agitated by a turbulent flow caused by the purge gas. When the purge gas and the general atmosphere are agitated in this manner, it takes a long time to complete replacing the internal atmosphere of the wafer storage space 72. Furthermore, due to the turbulent flow generated by the purge gas, dust remaining inside the carrier 16 is scattered inside the wafer storage space 72, and in some cases, the dust may be adhered to the wafer 15. Therefore, it is preferable that the side surface purge nozzles 49 are provided as illustrated in the embodiments of FIGS. 14A and 14B so that it is not necessary to strongly supply the purge gas from one position. In addition, it is preferable that an ejection suppressing member for reducing the flow rate of the supplied purge gas and diffusing the purge gas over a wide range is provided at the ejection port of the side surface purge nozzle 49. Due to the ejection suppressing member, the strength of the purge gas can be further reduced without reducing the supply amount of the purge gas.

The side surface purge nozzle 49 is a nozzle that supplies the purge gas to the inner portion of the wafer storage space 72 surrounded by the carrier 16, the shutter portion 42, and the shield cover 48. As illustrated in FIG. 14A, it is preferable that a plurality of side surface purge nozzles 49 are disposed above and to the left and right of the shield cover 48. Furthermore, with respect to the side surface purge nozzles 49 disposed on the upper shield cover 48, it is preferable that the position and number thereof are set such that the purge gas flows across the entire horizontal direction of the opening portions 16a and 41a. In addition, it is preferable that the side surface purge nozzles 49 disposed on the left and right shield covers 48 are disposed to correspond to the pitch in the vertical direction of the shelf plate 18 on which the carrier 16 is formed. In particular, it is preferable that the side surface purge nozzles 49 is disposed so that purge gas is supplied to each gap in the vertical direction of the wafer 15 mounted on each shelf 18.

The purge gas supplied from the plurality of side surface purge nozzles 49 pushes the general atmosphere inside the wafer storage space 72 out through the port opening portion 11, the gap between the flange portion 26 and the frame 41, and the gap between the frame 41 and the shielding plate 43 of the shutter portion 42. In addition, if the inner portion of the carrier 16 is filled with the purge gas through the bottom surface purge nozzle 66 in advance, the replacing of the atmosphere can be completed in a short time (refer to FIG. 14A).

In addition, FIGS. 14A, 14B, 18, and the like illustrate an example where the bottom surface purge nozzle 66 is disposed at a position close to the first opening portion on the bottom surface of the carrier 16. The bottom surface purge nozzle 66 may be disposed in the vicinity of the central portion of the bottom surface of the carrier 16 or may be disposed in the back side of the bottom surface of the carrier 16 as illustrated in FIG. 17B.

The bottom surface purge nozzle 66 has a shape corresponding to the purge port 39 provided on the bottom surface of the FOUP 12. In addition, the bottom surface purge nozzle 66 is configured to supply the purge gas to the inner portion of the FOUP 12 through the purge port 39, and the bottom surface purge nozzle 66 does not include such an ejection suppressing member included in the side surface purge nozzle 49. Instead, a check valve provided in the purge port 39 and a filter for removing impurities function as an ejection suppressing member. Furthermore, as illustrated in FIG. 14B, when the stage 14 is in the transfer position, since the flange portion 26 of the carrier 16 and the frame 41 are hermetically in contact with each other, the supply of the purge gas to the wafer storage space 72 is performed through the bottom surface purge nozzle 66. At this time, the internal atmosphere of the wafer storage space 72 is discharged to the outside through the gap between the frame 41 and the shielding plate 43 and the opening portion 65. The wafer 15 mounted in the carrier 16 serves as a rectification plate, so that the supplied purge gas is arranged into a parallel flow directed to the shutter portion 42.

In addition, in the embodiment, in the example illustrated in FIG. 14A, the side surface purge nozzles 49 are fixed to the shield cover 48. However, the side surface purge nozzles may also be fixed to the frame 41 as illustrated in FIG. 18. A second opening portion 41a through which the wafer 15 mounted on the shelf plate 18 of the carrier 16 can pass is formed in the frame 41. The side surface purge nozzles 49 are fixed to the upper side and the left and right sides of the frame 41 so that the purge gas can be supplied toward the opening portion 41a.

Various materials having a required ejection suppressing function with respect to the purge gas to be supplied can be used for the ejection suppressing member provided to the side surface purge nozzles 49 and the filter provided to the purge port 39, and in particular, a porous material is preferred. For example, it is possible to use an air filter member having a PTFE fine particle bonding composite member, a sintered metal, a sintered glass, an open cell glass, a laminated filter material, or a hollow fiber membrane as a filtering material. Furthermore, it is also possible to remove dust mixed in circulation through the piping. In addition, since a fine structure called a porous structure is used, it is possible to have a compact outer appearance while having a required ejection suppressing capability.

The purge port 40 of the present invention is provided with a shutter portion 42 and a mechanism for manipulating the shutter portion 42 which is protruded toward the mini-environment space 3 from the load port 2 of the related art. Herein, in the case where the carrier 16 is disposed at the wafer transfer position (the position in FIG. 10B) defined by the load port 2 of the related art, when the wafer 15 stored in the shelf portion inside the carrier 16 through the opening portion 65 of the shutter portion 42 is intended to be accessed, the finger of the transfer robot 4 of the related art is too short to access the wafer 15. Therefore, in the load port 40 according to the embodiment of the present invention, in order to access the wafer 15, the position of the carrier 16 is further moved to the third position where the position of the carrier is advanced toward the transfer robot 4, and the third position is set as the transfer position. By doing so, the transfer robot 4 can easily access the wafer 15 stored in the carrier 16 mounted on the load port 40 without replacing the finger 52 and the like. Namely, since the substrate storage container mounted on the load port 40 can be moved to a position that is advanced from the transfer position defined by the load port of the related art, a substrate transfer robot can access the substrate storage container mounted on the load port according to the present invention without special reformation.

Furthermore, since the load port 40 is configured to be in accordance with the standard defining the exclusion area of the mini-environment space 3 defined by SEMI (Semiconductor Equipment Material International) which is an international standard on semiconductor manufacturing equipment, it is possible to install the load port 40 according to the embodiment of the present invention at a location where the load port 2 of the related art is installed without special reformation of the hybrid processing apparatus 1.

Figure 15A:
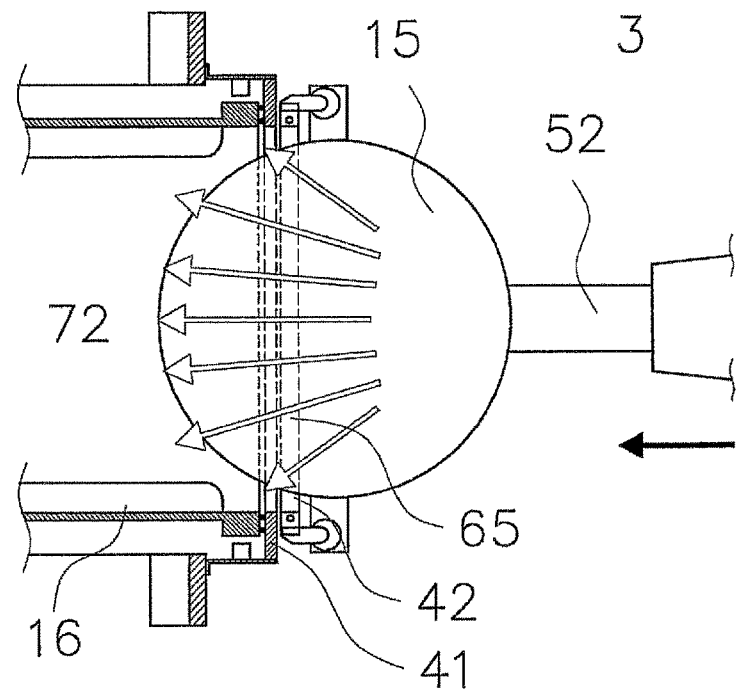
FIG. 15A is a cross-sectional top plan view showing a state of a downward flow in the vicinity of an opening portion with outlined arrows.
Figure 15B:
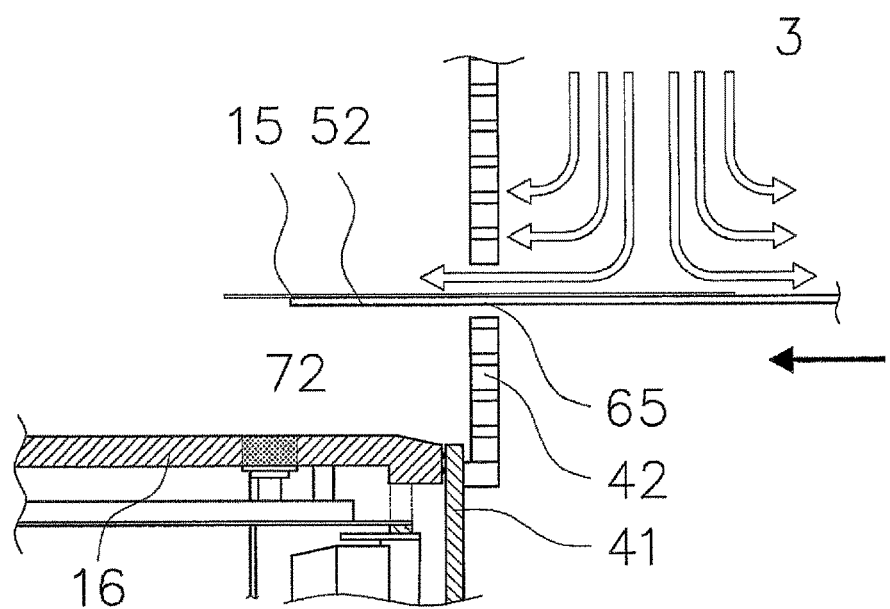
FIG. 15B is a partial cross sectional left side view showing a state of a downward flow in the vicinity of an opening portion with outlined arrows.
Figure 16A:
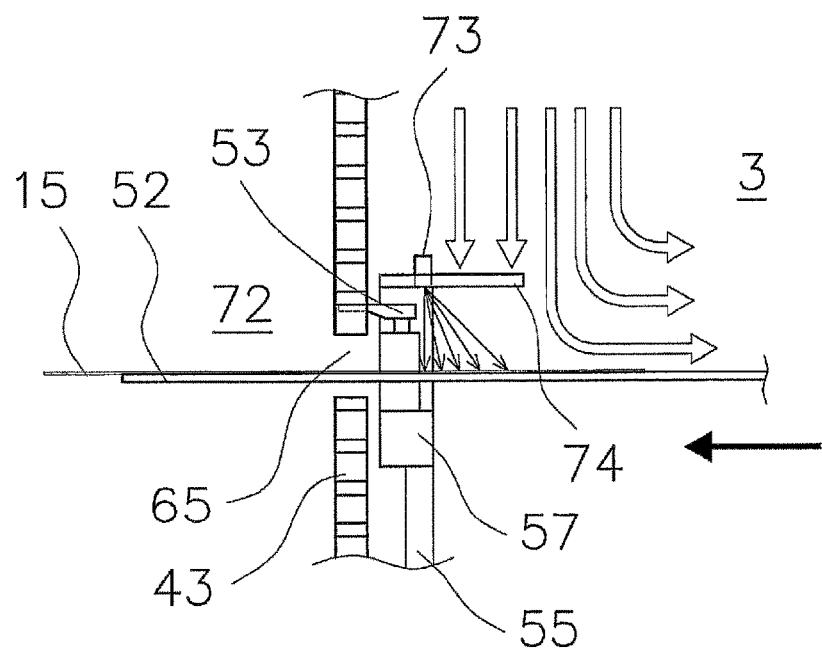
FIG. 16A is a left side view showing an opening-portion purge nozzle.
Figure 16B:
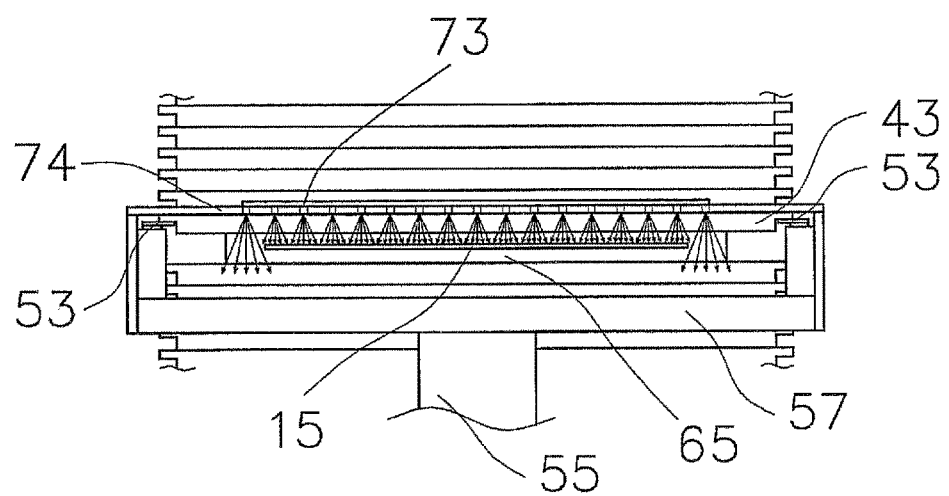
FIG. 16B is a front view showing an opening-portion purge nozzle.

In the load port 40 according to the embodiment of the present invention, when the stage 14 is at the transfer position that is the third position, the purge gas is supplied through the purge port 39, so that the inner portion of the wafer storage space 72 surrounded by the carrier 16, the frame 41, and the shutter portion 42 is maintained to have the purge gas atmosphere having a higher positive pressure than that of the surrounding environment. Therefore, dust and general atmosphere from the outside is prevented from entering. In addition, although the opening portion 65 for transferring in the shutter portion 42 is opened, the inner portion of the wafer storage space 72 is configured to be supplied with a purge gas at a flow rate which is sufficient to maintain a positive pressure atmosphere. However, among the existing hybrid processing apparatuses 1, there are ones that increase the rotation speed of the fan of the fan filter unit 5 to maintain a high positive pressure of the inner portion of the mini-environment space 3. In the mini-environment space 3 of such a hybrid processing apparatus 1, when the transfer robot 4 retains the wafer 15 and passes through the opening portion 65, the wafer 15 acts as a rectification plate, and thus, there is a possibility that a strong downward laminar flow from the fan filter unit 5 is changed into a horizontal airflow. As a result, as illustrated by outlined arrows in FIGS. 15A and 15B in some cases, the horizontal airflow containing oxygen and moisture enters the wafer storage space 72 from the mini-environment space 3 through the opening portion 65. Therefore, in the second embodiment of the load port of the present invention, as illustrated in FIGS. 16A and 16B, an eaves portion 74 for blocking the downward airflow from the mini-environment space 3 is provided above the opening portion 65, and one or a plurality of opening-portion purge nozzles 73 are provided in the eaves portion 74. FIGS. 16A and 16B illustrate an example of the second embodiment of the present invention, and FIGS. 16A and 16B are schematic diagrams as viewed from the side direction and the front direction, respectively, and are partial enlarged diagrams illustrating a supplied state of the purge gas from the opening-portion purge nozzle 73.

The eaves portion 74 is provided above the opening portion 65, and thus, the downward flow from the fan filter unit 5 is blocked, so that it is possible to reduce adverse influence on the purge gas. It is preferable that the eaves portion 74 is provided slightly above the opening portion 65 and is moved together with the opening portion 65. For example, a plate-shaped member is configured to be attached to the support member 57 through a bracket so as to be moved upward and downward together with the hook 53 and the shielding plate support mechanism 54 by the elevation drive mechanism 55. The eaves portion 74 is disposed so as not to be in contact with the shielding plate 43 of the shutter portion 42 and to protrude to the space side where the transfer robot 4 is disposed. In addition, in order to block the downward flow from the fan filter unit 5, the larger the area of the eaves portion 74 is, the greater the blocking effect is, but it is preferable that the eaves portion is disposed so as to be included within the exclusion area defined inside the mini-environment space 3.

Furthermore, by locally ejecting the purge gas from the opening-portion purge nozzle 73 which is the third purge nozzle provided in the eaves portion 74 to the vicinity of the opening portion 65, the downward flow from the fan filter unit 5 is prevented from intruding from the opening portion 65 into the wafer storage space 72. The opening-portion purge nozzle 73 are disposed on a straight line parallel to the shielding plate 43 constituting the opening portion 65 and are configured to eject the purge gas from the upper side to the opening portion 65 and the wafer 15 passing through the opening portion 65. Since the opening-portion purge nozzle 73 is attached to the eaves portion 74, the opening-portion purge nozzle can be moved upward and downward together with the hook 53 and the shielding plate support mechanism 54 like the eaves portion 74. Therefore, even if the opening portion 65 is formed at any position of the shutter portion 42, the positional relationship between the opening-portion purge nozzle 73 and the opening portion 65 is always constant. Furthermore, since the distance between the opening portion 65 and the opening-portion purge nozzle 73 is relatively small, it is possible to obtain a sufficient blocking effect by ejecting a relatively small amount of the purge gas as compared with other purge nozzles.

The supply of the purge gas from the opening-portion purge nozzle 73 is controlled by the control unit 37. When the opening portion 65 is closed, the purge gas is not supplied. When the opening portion 65 is opened, the control unit 37 opens the electromagnetic valve 70d and supplies the purge gas to the opening-portion purge nozzle 73. When the transfer robot 4 is to access the carrier 16, the control unit 37 starts the operation of the shielding plate drive unit 44 for opening and closing the shielding plate 43 and actuates the electromagnetic valve 70d to supply the purge gas to the opening-portion purge nozzle 73.

The opening-portion purge nozzle 73 does not have such an ejection suppressing member as the side surface purge nozzles 49 has, and the purge gas is ejected from the upper side to the wafer 15 retained on the finger 52 from the dot-like ejection port. The direction in which the purge gas is ejected may be the vertical direction from the upper side of the wafer 15. However, a turbulent flow caused by the ejection force of the purge gas entrains the air inside the mini-environment space 3, so that, in order to prevent the air from intruding into the wafer storage space 72 through the opening portion 65, it is preferable to eject the purge gas at a slight angle toward the direction in which the wafer 15 enters to the opening portion 65. In addition, the purge gas is regulated by the flow rate regulating valve 71d so as to have a flow rate which is sufficient to prevent the air supplied from the fan filter unit 5 from intruding into the wafer storage space 72 through the opening portion 65. With the above-described configuration, the air supplied from the fan filter unit 5 is prevented from intruding into the wafer storage space 72 through the opening portion 65 by the purge gas ejected from each opening-portion purge nozzle 73, and the inner portion of the wafer storage space 72 is maintained to be in a high-purity purge gas atmosphere. In addition, the components of the reaction gas adhered to the surface of the wafer 15 are also blown off by the purge gas ejected from the opening-portion purge nozzle 73, so that the possibility of impurities being mixed into the wafer storage space 72 with impurities is reduced.

By providing the opening-portion purge nozzle having such a configuration, it is possible to locally prevent the downward clean air supplied to the mini-environment space from intruding into the wafer storage space through the opening portion. In addition, since the eaves portion is moved upward and downward by the shielding plate drive unit which moves the shielding plate upward and downward, even if the opening portion is formed at any position in the vertical direction, the eaves portion can be configured to be always located above the opening portion.

Therefore, the strong downward laminar flow from the fan filter unit 5 collides with the substrate to change the direction, and thus, it is possible to block the clean air which is to intrude from the front through the third opening portion. Furthermore, since the opening-portion purge nozzle is attached to the eaves portion, the opening-portion purge nozzle is moved upward and downward together with the eaves portion, and thus, it is possible to locally supply the purge gas to the opening portion, and it is possible to prevent the concentration of the purge gas inside the wafer storage space from being decreased.

In addition, although the opening-portion purge nozzle 73 of the embodiment is configured to be attached to the eaves portion 74 and to eject the purge gas in the vertical direction from the upper side of the opening portion 65 toward the periphery of the opening portion 65, the present invention is not limited thereto. For example, the opening-portion purge nozzle 73 may be attached in the vicinity of a pair of the hooks 53, and the purge gas may be horizontally ejected from the side surface toward the periphery of the opening portion 65. In addition, it is also possible to provide a suction means below the shutter portion 42 for sucking the atmosphere, the reaction gas molecules, and the like discharged to the outside of the wafer storage space 72 from the gap between the frame 41 and the shutter portion 42. By providing the sucking means, the atmosphere replacement inside the wafer storage space 72 is completed in a short time. Specifically, it is preferable that the suction means is an axial flow fan, a pump, an air injector, or the like.

In the first and second embodiments of the load port of the present invention described above, the supply of the purge gas into the carrier 16 is performed through the purge port 39 provided on the bottom surface of the carrier 16. This is because the standard FOUP 13 is provided with the purge port 39 on the bottom surface thereof and effective atmosphere replacement is intended to be performed without special processing on the FOUP 13 or purchasing a special FOUP 13. However, in the method of supplying the purge gas from the bottom surface through the purge port 39 provided on the bottom surface of the general FOUP 13, the wafer 15 stored therein acts as a barrier, so that a time for allowing the purge gas to flow through the entire FOUP 13 is required. Therefore, the third embodiment of the load port of the present invention corresponds to the FOUP 13 that supplies the purge gas from the back side of the carrier 16 toward the opening portion 16a instead of the configuration of supplying the purge gas from the bottom surface of the carrier 16.

Figure 17A:
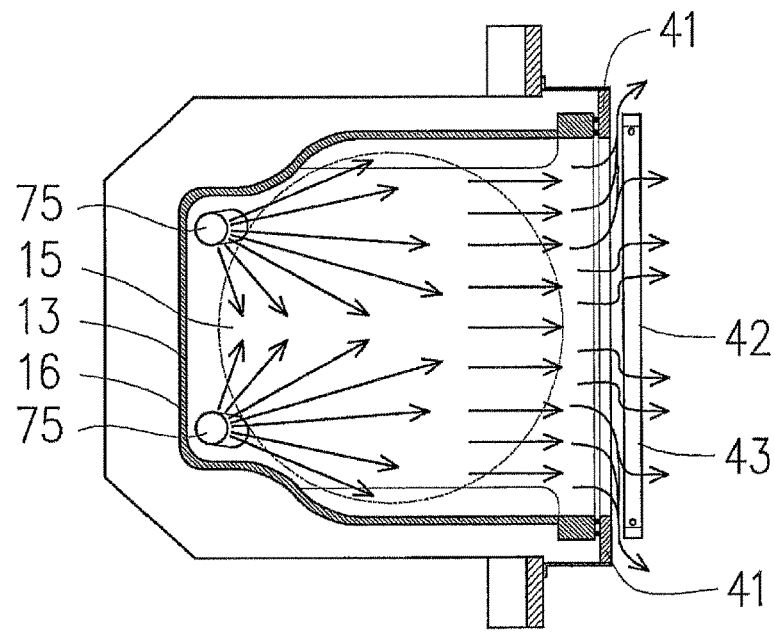
FIG. 17A is a cross-sectional top plan view showing an FOUP including a purge tower.
Figure 17B:
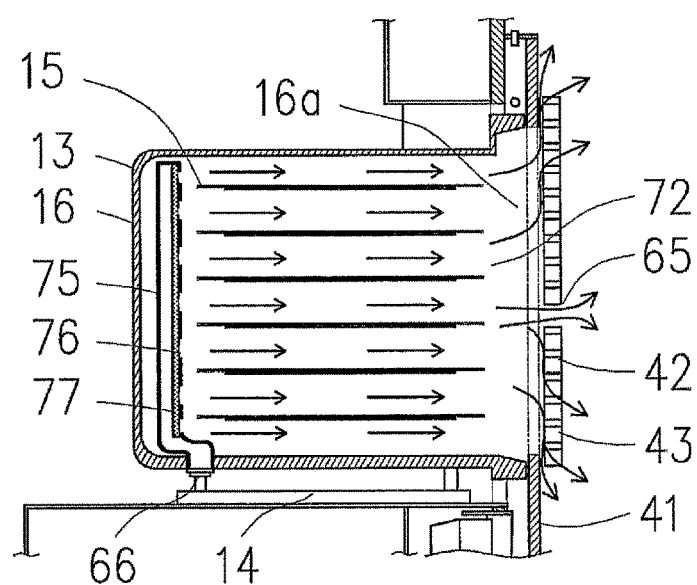
FIG. 17B is a cross-sectional side view showing an FOUP including a purge tower.

FIGS. 17A and 17B illustrate diagrams of the third embodiment of the present invention. And they are schematic diagrams as viewed from the planar direction and the side direction, respectively, and are partially enlarged diagrams illustrating a state where the purge gas is being supplied from the purge tower 75 provided inside the carrier 16. In the third embodiment of the present invention, as illustrated in FIGS. 17A and 17B, a bottom surface purge nozzle 66 is disposed behind the stage 14 in order to correspond to the purge tower 75 provided behind the inner portion of the carrier 16. The purge gas supplied through the bottom surface purge nozzle 66 is supplied to the inner portion of the carrier 16 from the cylindrical purge tower 75 provided behind the carrier 16. The purge tower 75 is a hollow cylindrical member, and a supply port 76 for supplying purge gas is provided to a predetermined portion thereof. Furthermore, an ejection suppressing member 77 which reduces the flow rate of the purge gas supplied from the supply port 76 and spreads the purge gas in a wide range is provided inside the purge tower 75. Various materials having a required ejection suppressing function with respect to the purge gas to be supplied can be used for the ejection suppressing member 77 provided inside the purge tower 75, and in particular, a porous material is preferred. For example, it is possible to use an air filter member having a PTFE fine particle bonding composite member, a sintered metal, a sintered glass, an open cell glass, a laminated filter material, or a hollow fiber membrane as a filtering material.

The supply port 76 formed in the purge tower 75 has a shape elongated in the horizontal direction (direction parallel to the wafer surface) in order to allow the purge gas to flow out over a wide range to the surface of the corresponding wafer 15. The purge gas flowing out from the supply port 76 forms an airflow for pushing the general atmosphere inside the carrier 16 toward the carrier opening portion 16a. The purge gas flowing out from the purge tower 75 also pushes, toward the carrier opening portion 16a, the molecules of the reaction gas remaining on the surface of the wafer 15 accommodated so as to be stacked in the vertical direction with a predetermined space inside the carrier 16. The purge gas supplied from the back side inside the carrier 16 and the oxidizing atmosphere pushed by the purge gas is discharged to the outside of the wafer storage space 72 through the gap provided between the frame 41 and the shielding plate 43 of the shutter portion 42. In particular, in the example of the embodiment, the flow parallel to the wafer 15 accommodated with the gap in the vertical direction is allowed to flow without changing the direction from the back side of the inner portion of the carrier 16 toward the front shutter portion 42. Therefore, occurrence of the turbulence flow is suppressed, and the atmosphere replacement is achieved in a short time.

The purge gas is supplied to the purge tower 75 at a desired timing by the control unit 37. Preferably, it is desirable to perform supplying at an appropriate flow rate at the same timing as the example illustrated in the other embodiment. For example, after the stage 14 has moved to the dock position that is the second position, it is desirable to start the supplying at the timing when the carrier 16 and the lid 17 are separated. In the embodiment, the purge gas is supplied from both of the two purge towers 75 toward the inner portion of the carrier 16. However, the present invention is not limited thereto. The purge gas may be supplied from the purge tower 75 toward the inner portion of the carrier 16, and the internal atmosphere of the carrier 16 may be sucked by the one purge tower 75.

While the embodiments of the present invention have been described above, the scope of the present invention is not limited to the embodiments exemplified above. For example, in the above-described embodiment, the shielding plate drive unit is configured to elevate the shielding plate so that the shielding plate is at the height of the opening portion (third opening portion 65) having substantially the same height as the height of one shelf. However, the size (height) of the opening portion of the third opening portion may be configured to be changed according to a command from the control portion.

Furthermore, in the above-described embodiment, a plurality of shielding plates equal in number to the shelves are configured to be stacked in the upward direction. Although it is preferable that one shielding plate is provided at a position corresponding to one shelf in this manner, one shielding plate may be configured to be provided so as to correspond to the height of two, three, or more shelves. In addition, in this case, it is preferable that the height of the third opening portion can be changed by the shielding plate drive unit.

If the height of the opening portion can be changed in this manner, for example, the third opening portion is allowed to have a height equal to or higher than the height of two shelves, so that when the substrate stored in the carrier 16 is to be moved toward another shelf in the same carrier, it is possible to efficiently perform the operation, In addition, in the above-described embodiment, the shielding plate stacked in the upper direction is exemplified as the shutter portion, and the shielding plate drive unit is exemplified as the shutter drive unit. However, the shutter portion and the shutter drive unit may have other forms.

For example, as the shutter portion, a plurality of flat-plate-shaped shielding plates rotatable in the horizontal axis direction are disposed corresponding to the pitch of the shelf plates, and the third opening portion may be opened and closed by selectively rotating each shielding plate. In this case, a motor for individually opening and closing the respective shielding plates or an electromagnetic type or an air driven type of an actuator is provided as the shutter drive unit, so that each shielding plate can be selectively opened and closed.

In addition, a plurality of flat plate-shaped shielding plates that are rotatable in the horizontal axis direction toward the inner portion of the carrier 16 are disposed corresponding to the pitch of the respective shelf plates, a hinge member is provided at the lower portion of each shielding plate, the shielding plate is pressed with the elastic force of a spring or the like in the closing direction of the shutter portion, the finger of the transfer robot is moved forward to push and open the shielding plate with the finger to be at the third opening portion, the finger continues to push the shielding plate while the finger is moved forward, so that the third opening portion is maintained to be opened, and if the finger is moved backward, the shielding plate returns to its original position by the elastic force (restoration force) such as a spring, so that the shutter portion is in a closed state.

Furthermore, an ultra-small motor is disposed inside each shielding plate, a rod-shaped rack gear is disposed on the frame 41, and a pinion gear fixed to the rotating shaft of the motor is combined with the above-mentioned rack gear, so that the shielding plates may be individually moved upward and downward by the rotation of the ultra-small motor.

Modifications of the mechanism for opening and closing the carrier 16 and the lid 17 are obvious to the skilled in the art. For example, the modification to a mechanism in which the FIMS door 12 integrated with the lid 17 is moved forward and backward with respect to the carrier 16 with the lower fulcrum as the rotation center is obvious. In addition, in the description of the present specification, the load port adapted to the wafer FOUP 13 and the FOUP 13 defined in the SEMI standard is disclosed, but the present invention is not limited thereto and may be applied to substrates requiring fine processing such a liquid crystal display substrate or a solar cell panel substrate.

The load port having an atmosphere replacing function according to the present invention can also be effectively adapted to a container that accommodates a substrate to be processed and hermetically seals the substrate from an external atmosphere, a transfer device that mounts or transfers the container, and a processing device that transfers an object to be processed from the container and performs predetermined processing.

EXPLANATIONS OF LETTERS OR NUMERALS

1 hybrid processing apparatus
2 load port
3 mini-environment space
4 transfer robot
5 fan filter unit
6 transfer chamber
7 various process chambers (processing apparatuses)
11 port opening portion
12 door (FIMS door)
13 FOUP
14 stage
15 wafer
16 carrier
16*a* first opening portion
17 lid of FOUP
18 shelf plate of carrier
19 door elevating unit (FIMS door elevating unit)
29 stage drive unit
37 control unit
41 frame
41*a* second opening portion
42 shutter portion
43 shielding plate
44 shielding plate drive unit
49, 66, 73 various purge nozzles
54 shielding plate support mechanism
55 elevation drive mechanism
56 hook drive means
65 third opening portion
74 eaves portion

The invention claimed is:

1. A load port having an atmosphere replacing function, a plurality of shelf plates being disposed at a certain interval in a vertical direction and being formed so as to mount and accommodate a plurality of substrates therein, mounting a substrate storage container having a first opening portion for loading and unloading the substrate and a lid portion capable of opening and closing the first opening portion, the load port for loading and unloading the substrate into and from the substrate storage container, the load port comprising:

a stage mounting and fixing the substrate storage container at a first position, a stage drive unit moving the stage forward and backward among the first position, a second position, and a third position;

a door being engaged with the lid portion of the substrate storage container at the second position as a position being moved forward from the first position to attach and detach the lid portion to and from the substrate storage container;

a door elevating unit moving the door upward and downward;

a frame being in contact with a peripheral edge of the substrate storage container at the third position as a position being further moved forward from the second position;

a shutter portion being capable of being partially opened and closed and being disposed so as to close a second opening portion surrounded by the frame on a side opposite to the substrate storage container of the frame;

a shutter drive unit selectively opening and closing a portion of the shutter portion so as to provide a third opening portion being smaller than the second opening portion at a desired position of the shutter portion; and at least one purge nozzle supplying a purge gas into the substrate storage container.

2. The load port having an atmosphere replacing function according to claim 1, wherein the shutter portion includes a plurality of shielding plates stacked so as to be movable upward and downward, and wherein the shutter drive unit includes a shielding plate drive unit opening and closing the third opening portion by being engaged with the shielding plate at a desired position to move the shielding plate and the shielding plates stacked on the shielding plate upward and downward.

3. The load port having an atmosphere replacing function according to claim 2, wherein the shutter portion includes the shielding plates, the number of the shielding plates being the same as the number of the shelf plates at positions corresponding to positions of the plurality of shelf plates.

4. The load port having an atmosphere replacing function according to claim 2, wherein the shutter portion includes the shielding plates, the number of the shielding plates being smaller than the number of the shelf plates.

5. The load port having an atmosphere replacing function according to claim 2, wherein the shielding plate drive unit changes a size of the opening portion by changing a vertical movement amount of the shielding plate.

6. The load port having an atmosphere replacing function according to claim 2, wherein the shielding plate drive unit opens and closes the third opening portion so as to have an opening portion height being the same as the interval between the shelf portions accommodating one substrate.

7. The load port having an atmosphere replacing function according to claim 2, wherein the shielding plate drive unit can selectively open and close the third opening portion so as to have an opening portion height being the same as an interval of the shelf portions accommodating one substrate or an opening portion height being an integral multiple of the interval.

8. The load port having an atmosphere replacing function according to claim 2, wherein the shielding plate is disposed so as to be movable upward and downward in a plane regulated by a positioning shaft.

9. The load port having an atmosphere replacing function according to claim 2, wherein an eaves portion being moved in the vertical direction by the shielding plate drive unit is disposed above the third opening portion.

10. The load port having an atmosphere replacing function according to claim 9, further comprising an opening-portion purge nozzle for ejecting a purge gas to a periphery of the third opening portion in the eaves portion.

11. The load port having an atmosphere replacing function according to claim 1, further comprising a bottom surface purge nozzle for supplying the purge gas from a bottom surface of the substrate storage container as the purge nozzle.

12. A load port atmosphere replacing method, a plurality of shelf plates being disposed at a certain interval in a vertical direction and being formed so as to mount and accommodate a plurality of substrates therein, a load port for loading and unloading the substrate into and from a substrate storage container having a first opening portion for loading and unloading the substrate and a lid portion capable of opening and closing the first opening portion, the load port atmosphere replacing method preventing oxidation of a semiconductor circuit formed on a surface of the substrate by speedily purging the surface of the substrate being loaded into the substrate storage container, the load port atmosphere replacing method comprising:

mounting the substrate storage container on a stage being stopped at a first position;

moving the stage forward from the first position to a second position to detach the lid of the substrate storage container;

supplying a purge gas into the storage container while further moving the stage forward from the second position;

moving the stage forward to a third position, the substrate being loaded and unloaded at the third portion, so as to allow the peripheral edge of the first opening portion of the substrate storage container to be in contact with the frame;

in response to an access request signal to a shelf portion of the substrate storage container, opening a portion of a shutter portion shielding a second opening portion as the opening portion of the frame, and forming a third opening portion having an opening portion being narrower than the first opening portion at a position corresponding to the position of the shelf portion associated with access request; and closing the third opening portion in response to an access end signal to the shelf portion.

13. The load port atmosphere replacing method according to claim 12, wherein in the forming the third opening portion, a purge gas is further supplied from an upper side of the third opening portion toward the third opening portion below while the opening portion is formed.

* * * * *